United States Patent
Hsu et al.

(10) Patent No.: US 12,264,972 B2
(45) Date of Patent: Apr. 1, 2025

(54) VERTICALLY INTEGRATED MICRO-BOLOMETER AND MANUFACTURING METHOD THEREOF

(71) Applicant: INDUSTRIAL TECHNOLOGY RESEARCH INSTITUTE, Hsinchu (TW)

(72) Inventors: Yu-Wen Hsu, Tainan (TW); Lu-Pu Liao, Taoyuan (TW); Chao-Ta Huang, Hsinchu (TW); Bo-Kai Chao, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 201 days.

(21) Appl. No.: 18/201,996

(22) Filed: May 25, 2023

(65) Prior Publication Data

US 2024/0219239 A1 Jul. 4, 2024

(30) Foreign Application Priority Data

Dec. 29, 2022 (TW) ................................ 111150625

(51) Int. Cl.
*G01J 5/20* (2006.01)
*H10N 19/00* (2023.01)

(52) U.S. Cl.
CPC ................ *G01J 5/20* (2013.01); *H10N 19/00* (2023.02)

(58) Field of Classification Search
CPC .... G01J 5/20; G01J 5/023; G01J 5/024; G01J 5/0853; G01J 1/42; H10N 19/00; A23B 2/767; G08G 5/55; H10F 30/28
See application file for complete search history.

(56) References Cited

U.S. PATENT DOCUMENTS 7,138,630 B2 11/2006 Vilain
8,471,204 B2 6/2013 Bornfreund
(Continued)

FOREIGN PATENT DOCUMENTS

CN 113015889 A 6/2021
EP 1 399 720 B1 11/2010
(Continued)

OTHER PUBLICATIONS

TW Office Action dated Nov. 7, 2023 as received in Application No. 111150625.
(Continued)

*Primary Examiner* — Edwin C Gunberg
*Assistant Examiner* — Richard O Toohey
(74) *Attorney, Agent, or Firm* — Maschoff Brennan

(57) ABSTRACT

A vertically integrated micro-bolometer includes an integrated circuit chip, an infrared sensing film, and a metal bonding layer. The integrated circuit chip includes a silicon substrate, a circuit element, and a dielectric layer disposed on the silicon substrate. The infrared sensing film includes a top absorbing layer, a sensing layer, and a bottom absorbing layer. The sensing layer is disposed between the top absorbing layer and the bottom absorbing layer. Materials of the top absorbing layer, the sensing layer, and the bottom absorbing layer are materials compatible with a semiconductor manufacturing process. The metal bonding layer connects the dielectric layer on the silicon substrate in the integrated circuit chip and the bottom absorbing layer of the infrared sensing film to form a vertically integrated micro-bolometer. In one embodiment, the infrared sensing film is divided into a central sensing film, a surrounding sensing film, and a plurality of connecting portions by a plurality of slots. The surrounding sensing film surrounds the central sensing film. Each of the connecting portions connects the (Continued)

surrounding sensing film and the central sensing film. A central distance from the bottom absorbing layer of the central sensing film to the silicon substrate is substantially equal to a surrounding distance from the bottom absorbing layer of the surrounding sensing film to the silicon substrate.

24 Claims, 20 Drawing Sheets

(56) References Cited

U.S. PATENT DOCUMENTS

| | | | |
|---|---|---|---|
| 8,587,083 | B2 | 11/2013 | Malm |
| 9,595,479 | B2 * | 3/2017 | Yang ............... H10D 62/405 |
| 11,359,970 | B2 | 6/2022 | Lee et al. |
| 2013/0235210 | A1 * | 9/2013 | Tinkler ............ H10F 39/1843 250/338.4 |
| 2020/0149973 | A1 | 5/2020 | Oulachgar |
| 2021/0302237 | A1 | 9/2021 | Takahashi et al. |

FOREIGN PATENT DOCUMENTS

| | | | | |
|---|---|---|---|---|
| KR | 102752630 | B1 * | 1/2025 | ............... H04N 5/33 |
| TW | 201438205 | A | 10/2014 | |
| TW | 202120893 | A | 6/2021 | |
| TW | 202125788 | A | 7/2021 | |
| WO | 2017/036675 | A1 | 3/2017 | |

OTHER PUBLICATIONS

Sherif Sedky, et al., "IR bolometers made of polycrystalline silicon germanium," Sensors and Actuators A: Physical, vol. 66, Issue 1-3, pp. 193-199 (Apr. 1, 1998).

S. Sedky, et al., "Characterization of Bolometers Based on Polycrystalline Silicon Germanium Alloys, " IEEE Electron Device Letters, vol. 19, Issue 10, pp. 376-378 (Oct. 1998).

M. García, et al., "IR bolometers based on amorphous silicon germanium alloys," Journal of Non-Crystalline Solids, vol. 338-340, pp. 744-748 (Jun. 15, 2004).

* cited by examiner

VERTICALLY INTEGRATED MICRO-BOLOMETER AND MANUFACTURING METHOD THEREOF

This non-provisional application claims priority under 35 U.S.C. § 119(a) on Patent Application No(s). 111150625 filed in Taiwan, R.O.C. on Dec. 29, 2022, the entire contents of which are hereby incorporated by reference.

TECHNICAL FIELD

The disclosure relates to a micro-bolometer and a manufacturing method thereof, especially to a vertically integrated micro-bolometer and its manufacturing method.

BACKGROUND

Recently, materials such as vanadium oxide or polysilicon are often used as sensing materials for sensing infrared rays when a semiconductor manufacturing process is used to manufacture a micro-bolometer. Vanadium oxide has the advantages of a low resistivity and a lower process temperature. However, when vanadium oxide is used to manufacture a sensing layer of the micro-bolometer, a quality of the manufacturing process can hardly be controlled, and the manufacturing process can hardly be compatible with a current semiconductor manufacturing process. Therefore, when vanadium oxide is used for sensing materials of the micro-bolometer, the manufacturing yield of the micro-bolometer cannot be improved and the manufacturing cost thereof cannot be reduced.

Additionally, when polysilicon is used to manufacture the sensing layer of the micro-bolometer, the manufacturing process may be compatible with the current semiconductor manufacturing process. However, a resistivity of polysilicon is higher than that of vanadium oxide. Therefore, a measurement sensitivity of the micro-bolometer is reduced. In addition, a high process temperature for manufacturing the infrared sensing layer by polysilicon will not only change properties of the polysilicon material, but also damage one or more circuit elements in an integrated circuit chip, thereby reducing the measurement accuracy of the micro-bolometer and a manufacturing yield thereof during a mass production.

Therefore, recently, for manufacturing the infrared sensing layer with a low resistivity, there is no manufacturing process compatible with the semiconductor manufacturing process. On the other hand, when the infrared sensing layer is manufactured by the semiconductor manufacturing process, not only a resistivity of the infrared sensing layer is higher, but also a temperature required for forming the infrared sensing layer is higher. Therefore, when the infrared sensing layer is integrated with the integrated circuit chip, the high temperature will damage one or more circuit elements in the integrated circuit chip. Therefore, after integrating the infrared sensing layer and the integrated circuit chip by the current semiconductor manufacturing process technology, not only the manufacturing yield of the integrated micro-bolometer will be reduced, but also the measurement sensitivity will be reduced.

SUMMARY

This disclosure is to disclose a vertically integrated micro-bolometer and its manufacturing process, which produces an infrared sensing layer with low resistivity while preventing damage to both the integrated circuit chip and infrared sensing layer during integration.

One embodiment of the disclosure provides a vertically integrated micro-bolometer for sensing an infrared ray with a wavelength, including an integrated circuit chip, an infrared sensing film, and a metal bonding layer. The integrated circuit chip includes a silicon substrate, a circuit element, and a dielectric layer. The dielectric layer is disposed on the silicon substrate and exposes a part of the silicon substrate. The infrared sensing film is a flat multilayer structure and includes a top absorbing layer, a sensing layer, and a bottom absorbing layer. Materials of the top absorbing layer and the bottom absorbing layer are materials compatible with a semiconductor manufacturing process. The sensing layer is disposed between the top absorbing layer and the bottom absorbing layer. A material of the sensing layer is a material compatible with the semiconductor manufacturing process and is silicon germanium alloy (SiGe) or silicon carbide (SiC). The metal bonding layer connects the dielectric layer and the bottom absorbing layer so that the infrared sensing film is vertically integrated on the integrated circuit chip and the sensing layer is electrically connected to the circuit element.

Another embodiment of the disclosure provides a manufacturing method of a vertically integrated micro-bolometer which includes the following steps. A step is performed to set a wavelength of an infrared ray to be measured. A step is performed to provide an integrated circuit wafer including a plurality of circuit elements and a silicon substrate. A step is performed to perform a deposition manufacturing process on the integrated circuit wafer to form a first wafer. The deposition manufacturing process includes depositing a dielectric layer on the silicon substrate, depositing a plurality of metal reflective layers on the silicon substrate, and depositing a first metal bonding layer on the dielectric layer. The circuit elements, the silicon substrate, the dielectric layer, and the metal reflective layers form a plurality of integrated circuit chips which are connected to each other. A step is performed to provide a supporting wafer. A step is performed to perform an infrared sensing film manufacturing process on the supporting wafer to form a second wafer. The infrared sensing film manufacturing process includes the following procedures. A step is performed to perform a semiconductor manufacturing process to deposit an infrared sensing film on the supporting wafer, wherein the infrared sensing film includes a top absorbing layer, a sensing layer, and a bottom absorbing layer, the top absorbing layer is deposited on the supporting wafer, the sensing layer is deposited on the top absorbing layer, the bottom absorbing layer is deposited on the sensing layer, and a material of the sensing layer is a material compatible with a semiconductor manufacturing process and is silicon germanium alloy (SiGe) or silicon carbide (SiC). A step is performed to deposit a second metal bonding layer on the bottom absorbing layer. A step is performed to perform a wafer metal bonding manufacturing process to bond the second wafer to the first wafer so that the first metal bonding layer of the first wafer is connected to the second metal bonding layer of the second wafer to form a metal bonding layer. A step is performed to remove the supporting wafer of the second wafer so that the infrared sensing film forms a flat multilayer structure. A step is performed to etch the infrared sensing film so that the infrared sensing film has a plurality of slots to form a plurality of vertically integrated micro-bolometers which are connected to each other. A step is performed to perform a die-dicing manufacturing process to separate the plurality of vertically integrated micro-bolometers which are connected to each other.

In one embodiment of the disclosure, the vertically integrated micro-bolometer and its manufacturing method improve the measurement sensitivity of vertically integrated infrared sensing devices by utilizing a sensing layer made from compatible materials with low resistivity, such as silicon-germanium alloy (SiGe) or silicon carbide (SiC). Also, the manufacturing method reduces production costs while enhancing the yield of the micro-bolometer. In addition, by utilizing a low-temperature wafer metal bonding manufacturing process, the infrared sensing film is bonded vertically to the integrated circuit chip, preventing damage to the circuit element within the integrated circuit chip due to the high temperature for depositing the infrared sensing film. More specifically, the sensing layer made from compatible materials with low resistivity integrates vertically with the integrated circuit chip, so that the manufacturing method reduces the bottom area of the vertically integrated micro-bolometer, effectively lowering the manufacturing cost of the vertically integrated micro-bolometer. As a result, the device is more suitable for use in products such as smartphones or smartwatches.

The above description about the content of the disclosure and the following description about the embodiments are used to demonstrate and explain the spirit and principle of the disclosure and provide a further explanation of the scope of claims of the disclosure.

BRIEF DESCRIPTION OF THE DRAWINGS

The disclosure will become better understood from the detailed description given hereinbelow and the accompanying drawings which are given by way of illustration only and thus are not intending to limit the disclosure and wherein.

DETAILED DESCRIPTION

Figure 1A:
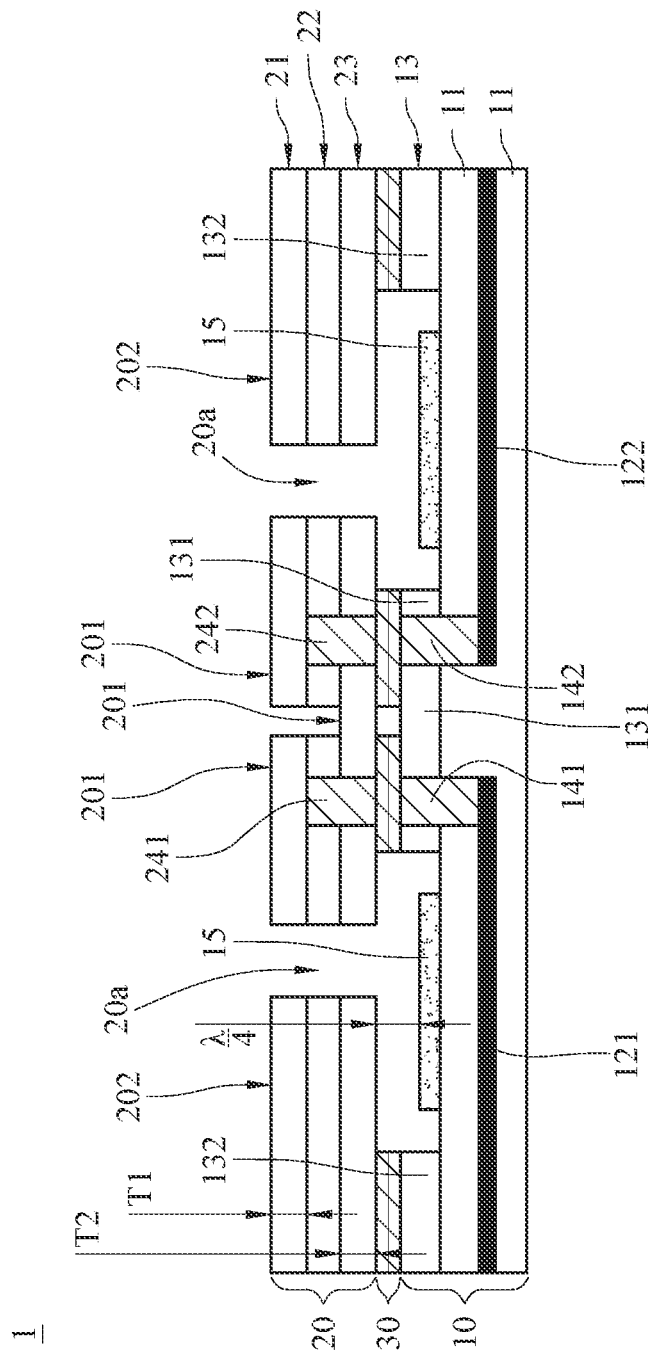
FIG. 1A to FIG. 1D are schematic side cross-sectional views of a vertically integrated micro-bolometer according to one embodiment of the disclosure.

Features and advantages of embodiments of the disclosure are described in the following detailed description, it allows the person skilled in the art to understand the technical contents of the embodiments of the disclosure and implement them, and the person skilled in the art can easily comprehend the purposes of the advantages of the disclosure. The following embodiments are further illustrating the perspective of the disclosure, but not intending to limit the disclosure.

The drawings may not be drawn to actual size or scale, some exaggerations may be necessary in order to emphasize basic structural relationships, while some are simplified for clarity of understanding, but the disclosure is not limited thereto. It is allowed to have various adjustments under the spirit of the disclosure. In addition, the spatially relative terms, such as "up", "top", "above", "down", "low", "left", "right", "front", "rear", and "back" and the like, may be used herein for ease of description to describe the relationship of one element or feature to another element(s) of feature(s) as illustrated in the drawings. It will be understood that the spatially relative terms are intended to encompass orientations of the element or feature but not intended to limit the disclosure.

Figure 1B:
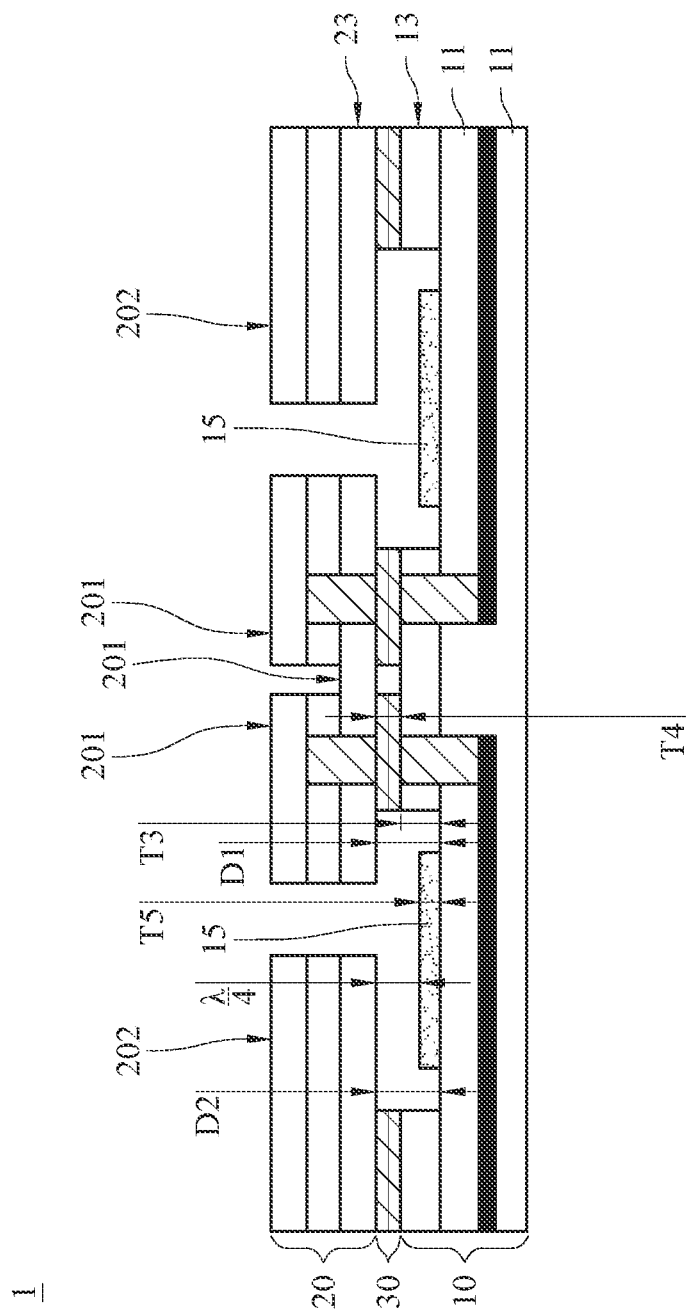
Figure 1C:
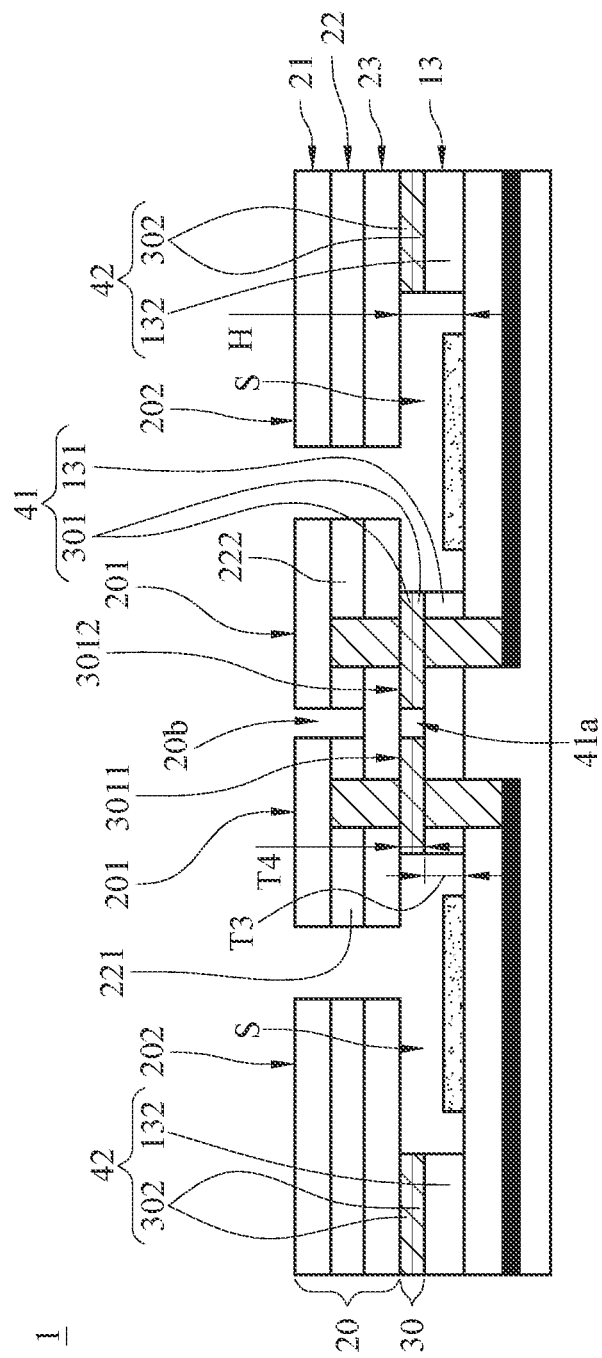
Figure 1D:
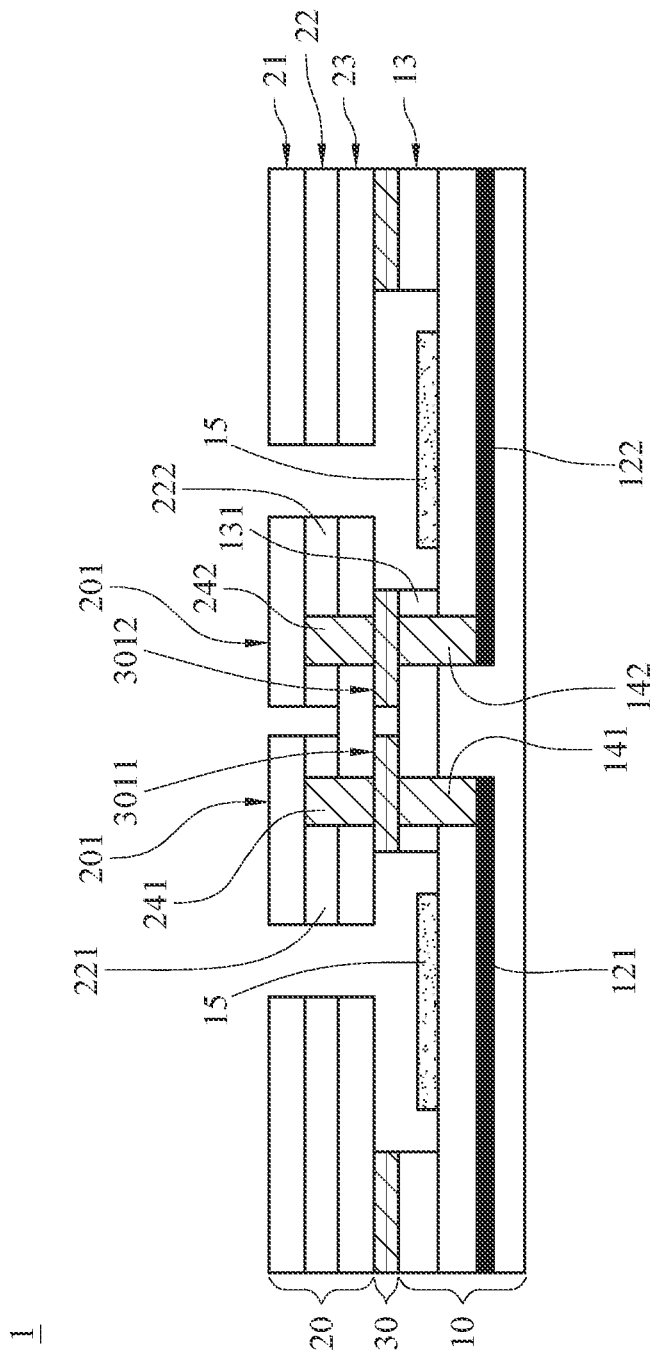
Figure 2:
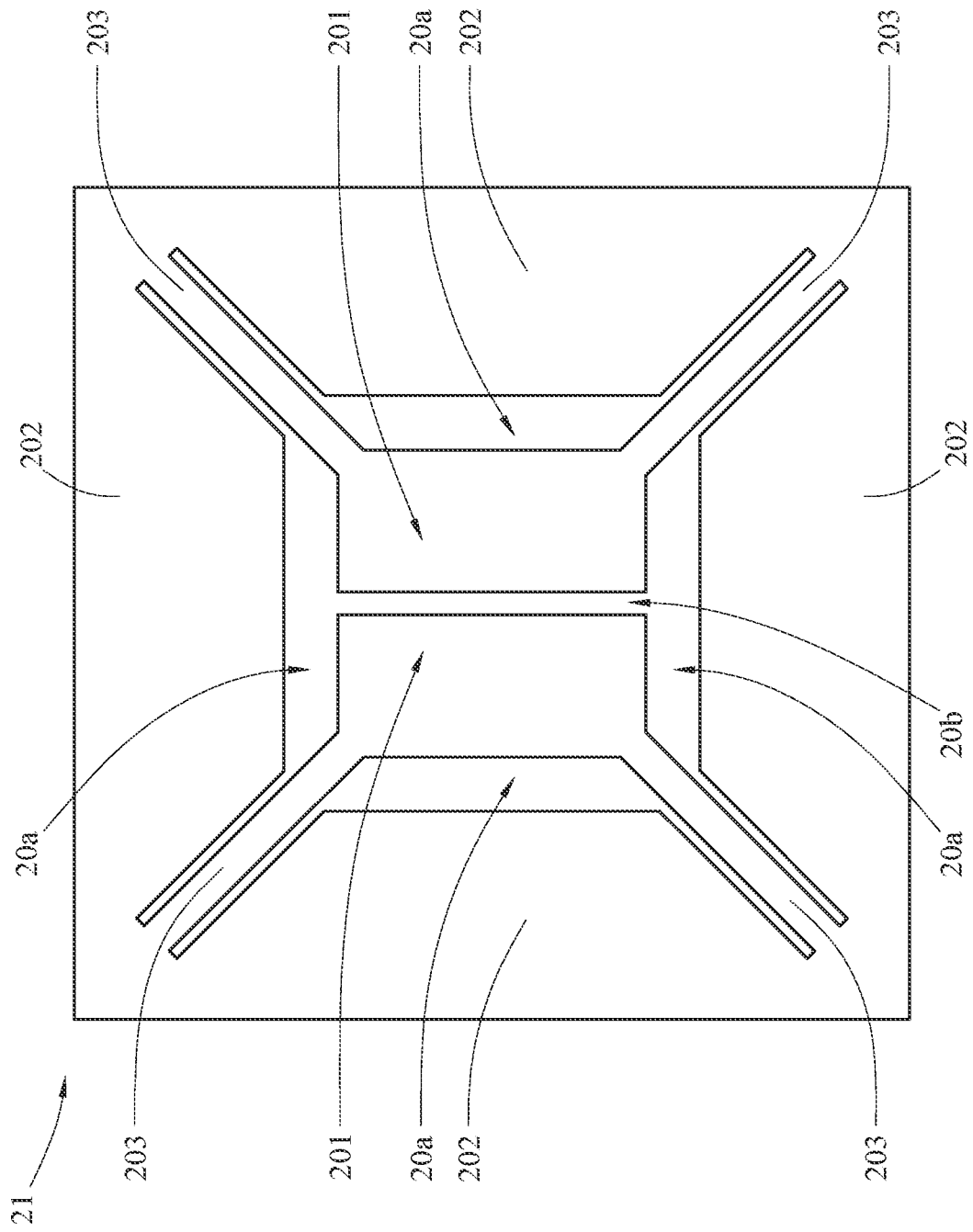
FIG. 2 is a schematic top view of a top absorbing layer in an infrared sensing film of the vertically integrated micro-bolometer in FIG. 1A to FIG. 1D.

Please refer to FIG. 1A to FIG. 1D and FIG. 2. FIG. 1A to FIG. 1D are schematic side cross-sectional views of a vertically integrated micro-bolometer 1 according to one embodiment of the disclosure. FIG. 2 is a schematic top view of a top absorbing layer in an infrared sensing film of the vertically integrated micro-bolometer in FIG. 1A to FIG. 1D. The vertically integrated micro-bolometer 1 is for sensing an infrared ray with a wavelength λ.

As shown in FIG. 1A and FIG. 2, the vertically integrated micro-bolometer 1 includes an integrated circuit chip 10, an infrared sensing film 20, and a metal bonding layer 30. The integrated circuit chip 10 includes a silicon substrate 11, at least one circuit element (not shown), an electrically conductive trace 121, an electrically conductive trace 122, a dielectric layer 13, a first positive electrically conductive element 141, a first negative electrically conductive element 142, and a metal reflective layer 15. The circuit element (not shown), the electrically conductive trace 121, and the electrically conductive trace 122 are disposed in the silicon substrate 11. The dielectric layer 13 is disposed on a central portion of the silicon substrate 11 and on a peripheral portion of the silicon substrate 11. The metal reflective layer 15 is disposed on a portion of the silicon substrate 11 where the dielectric layer 13 is not disposed; that is, the metal reflective layer 15 is disposed on the portion of the silicon substrate 11 uncovered and exposed by the dielectric layer 13. The dielectric layer 13 includes a central dielectric layer 131 and a surrounding dielectric layer 132 surrounding the central dielectric layer 131. The central dielectric layer 131 is disposed on the central portion of the silicon substrate 11, and the surrounding dielectric layer 132 is disposed on the peripheral portion of the silicon substrate 11.

The infrared sensing film 20 is a flat multilayer structure having a plurality of layers. Although the infrared sensing film 20 is partially suspended or not supported, the infrared sensing film 20 still is maintained to be in a flat shape. The infrared sensing film 20 includes a top absorbing layer 21, a sensing layer 22, a bottom absorbing layer 23, a second positive electrically conductive element 241, and a second negative electrically conductive element 242. The sensing layer 22 is disposed between the top absorbing layer 21 and the bottom absorbing layer 23. A thickness T1 of the top absorbing layer 21 is substantially equal to a thickness T2 of the bottom absorbing layer 23. In this way, when the top absorbing layer 21 and the bottom absorbing layer 23 absorb the infrared ray and then generate heat, a high thermal stress is generated neither between the top absorbing layer 21 and the sensing layer 22 nor between the bottom absorbing layer 23 and the sensing layer 22, thereby avoid the infrared sensing film 20 from warping or delaminating.

As shown in FIG. 2, the infrared sensing film 20 is divided into a central sensing film 201, a surrounding sensing film 202, and a plurality of connecting portions 203 by a plurality of slots 20a. The surrounding sensing film 202 surrounds the central sensing film 201, and each of the connecting portions 203 connects the surrounding sensing film 202 and the central sensing film 201. The heat generated by the top absorbing layer 21 and the bottom absorbing layer 23 can be kept in the central sensing film 201 through the aforementioned configuration of the infrared sensing film 20, thereby improving a measurement sensitivity of the vertically integrated micro-bolometer 1. In this embodiment, there are four connecting portions 203. The central sensing film 201 is in a rectangular shape. The surrounding sensing film 202 is configured by four trapezoidal parts which are connected to each other. Each of the connecting portions 203 is disposed between adjacent trapezoidal parts.

As shown in FIG. 1B, the metal bonding layer 30 connects the dielectric layer 13 of the integrated circuit chip 10 and the bottom absorbing layer 23 of the infrared sensing film 20 so that the integrated circuit chip 10 and the infrared sensing film 20 form the vertically integrated micro-bolometer 1. After the integrated circuit chip 10 and the infrared sensing film 20 are vertically integrated, not only a footprint area of the vertically integrated micro-bolometer 1 is significantly reduced, but also the infrared sensing film 20 is still maintained to be a flat multilayer structure, thereby reducing a complexity of a manufacturing process of the infrared sensing film 20 and improving the manufacturing yield. This flat multilayer structure allows a central distance D1 from a lower surface of the bottom absorbing layer 23 of the central sensing film 201 to an upper surface of the silicon substrate 11 is substantially equal to a surrounding distance D2 from an lower surface of the bottom absorbing layer 23 of the surrounding sensing film 202 to the upper surface of the silicon substrate 11. Furthermore, the central distance D1 is substantially equal to a sum of a thickness T3 of the dielectric layer 13 and a thickness T4 of the metal bonding layer 30. The surrounding distance D2 is substantially equal to the sum of the thickness T3 of the dielectric layer 13 and the thickness T4 of the metal bonding layer 30.

The sum of the thickness T3 of the dielectric layer 13 and the thickness T4 of the metal bonding layer 30 is substantially equal to a sum of a thickness T5 of the metal reflective layer 15 and a quarter of the wavelength (i.e. $\lambda/4$) of the infrared ray. In other words, a distance from the lower surface of the bottom absorbing layer 23 to an upper surface of the metal reflective layer 15 is substantially equal to the quarter of the wavelength (i.e. $\lambda/4$). In this way, when the bottom absorbing layer 23 absorbs the infrared ray reflected by the metal reflective layer 15, a maximum amount of heat is generated, thereby improving the measurement sensitivity of the vertically integrated micro-bolometer 1.

As shown in FIG. 1C, the metal bonding layer 30 includes a central bonding layer 301 and a surrounding bonding layer 302 which surrounds the central bonding layer 301. A central anchor 41 includes the central bonding layer 301 and the central dielectric layer 131. A lower surface of the central bonding layer 301 is connected to an upper surface of the central dielectric layer 131 to form a central anchor 41. When the top absorbing layer 21 and the bottom absorbing layer 23 absorb an energy of the infrared ray and then generate the heat, the central anchor 41 will have a minimum amount of displacement (or strain) on a plane where the central sensing film 201 is located, thereby avoid the central sensing film 201 from cracking. An upper surface of the central bonding layer 301 is connected to the bottom absorbing layer 23 of the central sensing film 201 to support the central sensing film 201. A lower surface of the surrounding bonding layer 302 is connected to an upper surface of the surrounding dielectric layer 132 to form a surrounding wall 42. An upper surface of the surrounding bonding layer 302 is connected to the bottom absorbing layer 23 of the surrounding sensing film 202 to form a thermally insulating cavity S surrounding the central anchor 41. A height H of the thermally insulating cavity S is substantially equal to the sum of the thickness T3 of the dielectric layer 13 and the thickness T4 of the metal bonding layer 30.

The thermally insulating cavity S allows the vertically integrated micro-bolometer 1 to accumulate the heat generated by the infrared ray therein. Thus, the heat generated by the infrared ray and absorbed by the top absorbing layer 21 and the bottom absorbing layer 23 is prevented from being dissipated quickly, thereby ensuring a measurement accuracy of the vertically integrated micro-bolometer 1.

The central anchor 41 has a bonding layer recess 41a. The central bonding layer 301 includes a positive bonding layer 3011 and a negative bonding layer 3012 which are separated and electrically insulated from each other by the bonding layer recess 41a. The central sensing film 201 has a sensing layer recess 20b. The sensing layer 22 of the central sensing film 201 includes a positive sensing layer 221 and a negative sensing layer 222 which are separated and electrically insulated from each other by the sensing layer recess 20b. The central sensing film 201 with the sensing layer recess 20b allows a thermal stress endured by the positive sensing layer 221 and the negative sensing layer 222 to be reduced and thus improves a reliability of the central sensing film 201.

As shown in FIG. 1D, the first positive electrically conductive element 141 is disposed through the central dielectric layer 131 and partially disposed through the silicon substrate 11, and is electrically connected to the electrically conductive trace 121. The second positive electrically conductive element 241 is disposed through the bottom absorbing layer 23 and the positive sensing layer 221 of the central sensing film 201, and is electrically connected to the positive sensing layer 221. The positive bonding layer 3011 connects the first positive electrically conductive element 141 and the second positive electrically conductive element 241 to form a positive electrical channel so that the positive electrical channel is electrically connected to the electrically conductive trace 121 and the positive sensing layer 221.

The first negative electrically conductive element 142 is disposed through the central dielectric layer 131 and partially disposed through the silicon substrate 11, and is electrically connected to the electrically conductive trace 122. The second negative electrically conductive element 242 is disposed through the bottom absorbing layer 23 and the negative sensing layer 222 of the central sensing film 201, and is electrically connected to the negative sensing layer 222. The negative bonding layer 3012 connects the first negative electrically conductive element 142 and the second negative electrically conductive element 242 to form a negative electrical channel so that the negative electrical channel is electrically connected to the electrically conductive trace 122 and the negative sensing layer 222.

In addition, in a prior art, if the infrared sensing film is directly formed on the integrated circuit chip by a semiconductor manufacturing process, a manufacturing process performed with a high temperature for depositing the top absorbing layer, the sensing layer, and the bottom absorbing layer often causes the circuit element in the integrated circuit chip to malfunction. However, in this embodiment, before performing a manufacturing process of connecting the integrated circuit chip 10 and the infrared sensing film 20 through the metal bonding layer 30, the top absorbing layer 21, the sensing layer 22, and the bottom absorbing layer 23 of the infrared sensing film 20 are sequentially formed on a supporting wafer firstly by the semiconductor manufacturing process performed with a high temperature. Then, the metal bonding layer 30 connects the integrated circuit chip 10 and the infrared sensing film 20 through a wafer metal bonding manufacturing process performed with a low temperature. Therefore, through the metal bonding layer 30, not only the infrared sensing film 20 is vertically integrated on the integrated circuit chip 10 to reduce the footprint area of the vertically integrated micro-bolometer 1, but also the circuit element in the integrated circuit chip 10 may further be avoided from malfunctioning due to the manufacturing process with a high temperature of depositing the infrared sensing film 20.

In this disclosure, "materials compatible with a semiconductor manufacturing process" are defined as materials being able to be used in the semiconductor manufacturing process. In this embodiment, because all materials used in the vertically integrated micro-bolometer 1 are compatible with the semiconductor manufacturing process, the vertically integrated micro-bolometer 1 in this embodiment may be manufactured by the current semiconductor manufacturing process. For example, a material of the dielectric layer 13 may include silicon dioxide ($SiO_2$). A material of the metal reflective layer 15 may include aluminum (Al). A material of the top absorbing layer 21 may include silicon nitride ($SiN_x$), silicon oxide ($SiO_x$), or silicon oxynitride ($SiO_xN_y$). A material of the sensing layer 22 may include silicon germanium alloy (SiGe) or silicon carbide (SiC). A material of the bottom absorbing layer 23 may include silicon nitride ($SiN_x$), silicon oxide ($SiO_x$), or silicon oxynitride ($SiO_xN_y$). A material of the first positive electrically conductive element 141, a material of the second positive electrically conductive element 241, a material of the first negative electrically conductive element 142, a material of the second negative electrically conductive element 242, and a material of the metal bonding layer 30 may include copper. In this way, through the current semiconductor manufacturing process, one wafer including the infrared sensing film 20 is bonded to another wafer including a plurality of integrated circuit chips 10. Then, a die-dicing process is performed to enable the mass production of the vertically integrated micro-bolometer 1 of this disclosure. Because the resistivity of silicon germanium alloy (SiGe) or silicon carbide (SiC) is lower than that of polysilicon, the vertically integrated micro-bolometer 1 of this disclosure has a higher measurement sensitivity. In addition, material properties of silicon germanium alloy (SiGe) or silicon carbide (SiC) are also more stable than those of polysilicon; that is, the material properties of silicon germanium alloy (SiGe) or silicon carbide (SiC) are more difficult to be changed, so the vertically integrated micro-bolometer 1 of this disclosure has a higher reliability.

When the vertically integrated micro-bolometer 1 is used, the infrared ray with the wavelength, may be incident on the infrared sensing film 20. A part of this infrared ray with the wavelength a passes through the top absorbing layer 21, the sensing layer 22, and the bottom absorbing layer 23. After the top absorbing layer 21 and the bottom absorbing layer 23 absorb an energy of this infrared ray, the heat is generated, thereby changing a resistance value of the sensing layer 22. The circuit element (not shown) is electrically connected to one electrical channel formed by the electrically conductive trace 121 and the positive electrical channel, and is electrically connected to another electrical channel formed by the negative electrical channel, and the electrically conductive trace 122, such that the circuit element (not shown) is able to obtain an intensity of the sensed infrared ray by measuring a change amount of an equivalent resistance value of the whole sensing layer 22.

Figure 3:
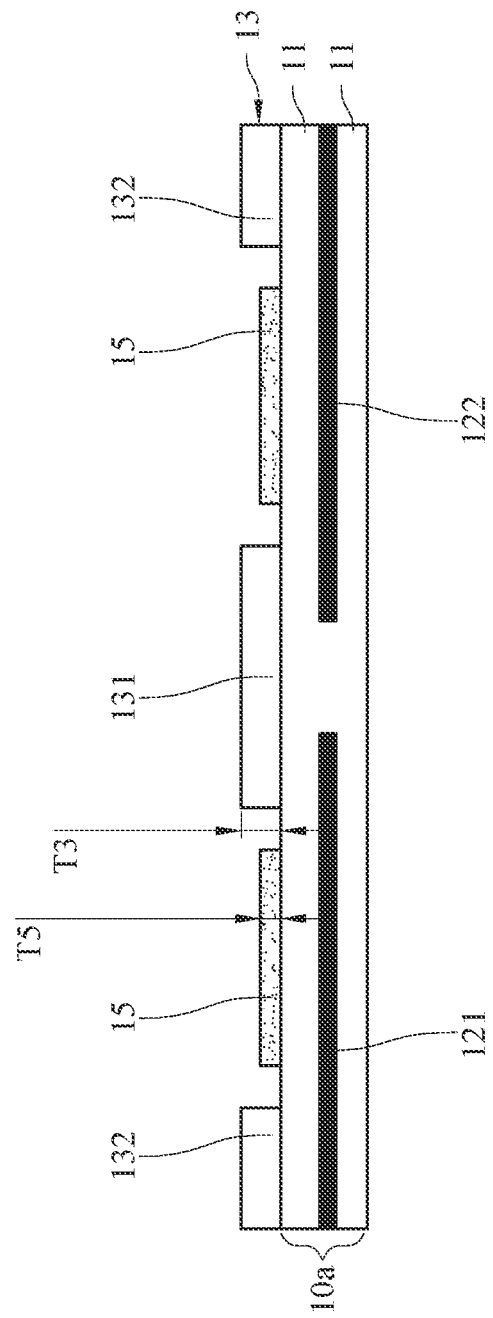
FIG. 3 is a schematic side cross-sectional view illustrating a manufacturing method of the vertically integrated micro-bolometer in FIG. 1A to FIG. 1D.
Figure 4:
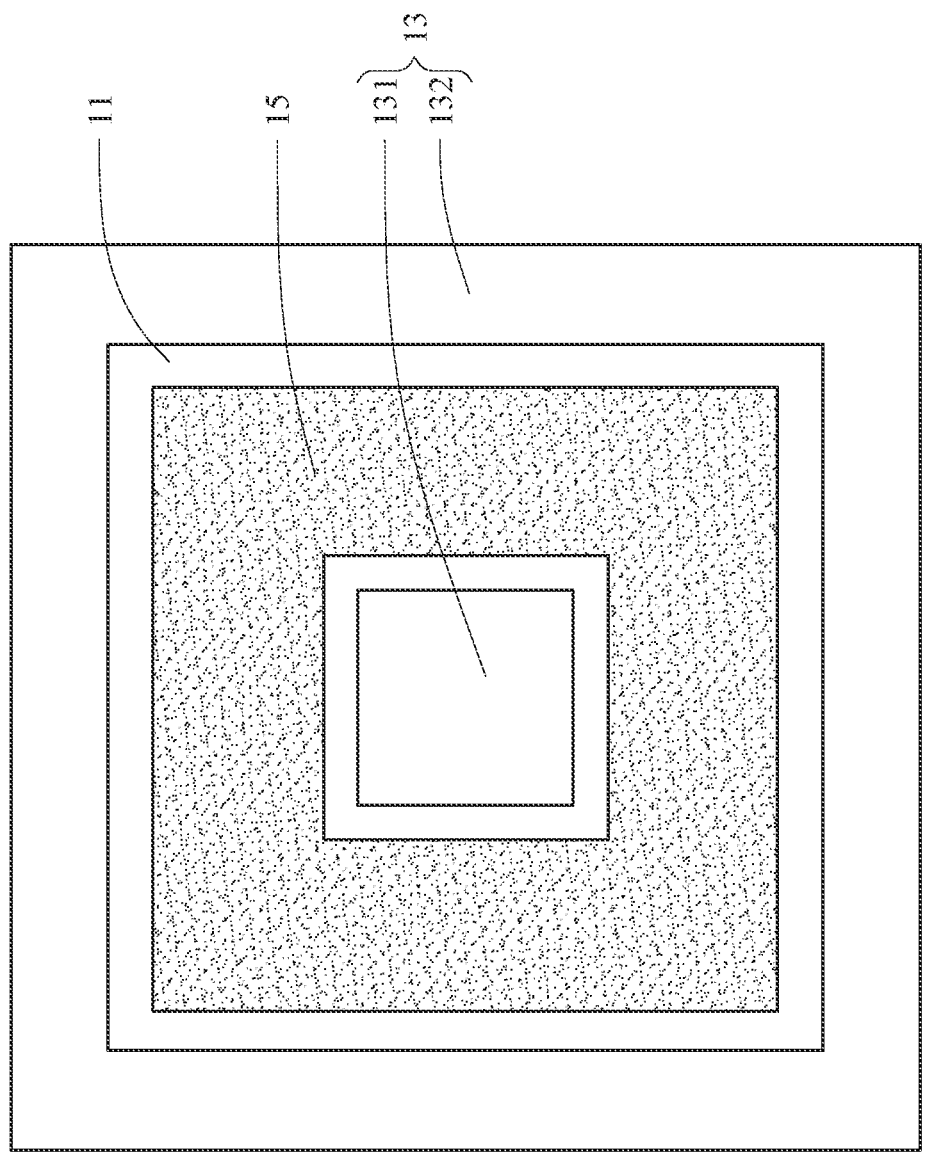
FIG. 4 is a schematic top view of FIG. 3.
Figure 7:
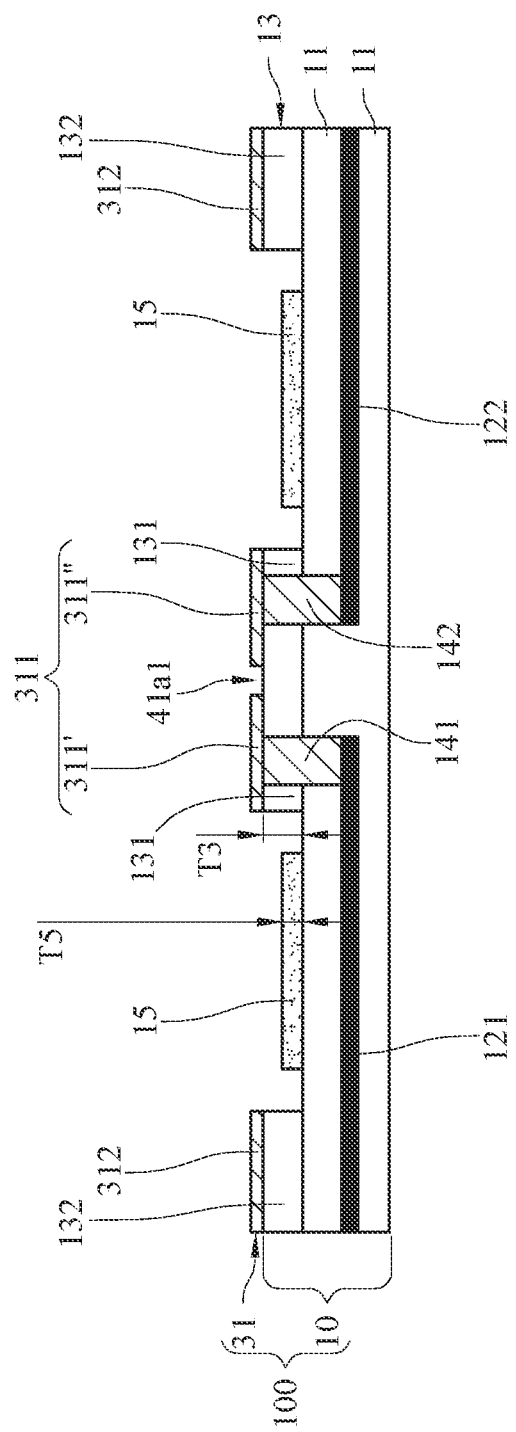
FIG. 7 is a schematic side cross-sectional view illustrating a manufacturing method of the vertically integrated micro-bolometer in FIG. 1A to FIG. 1D.
Figure 8:
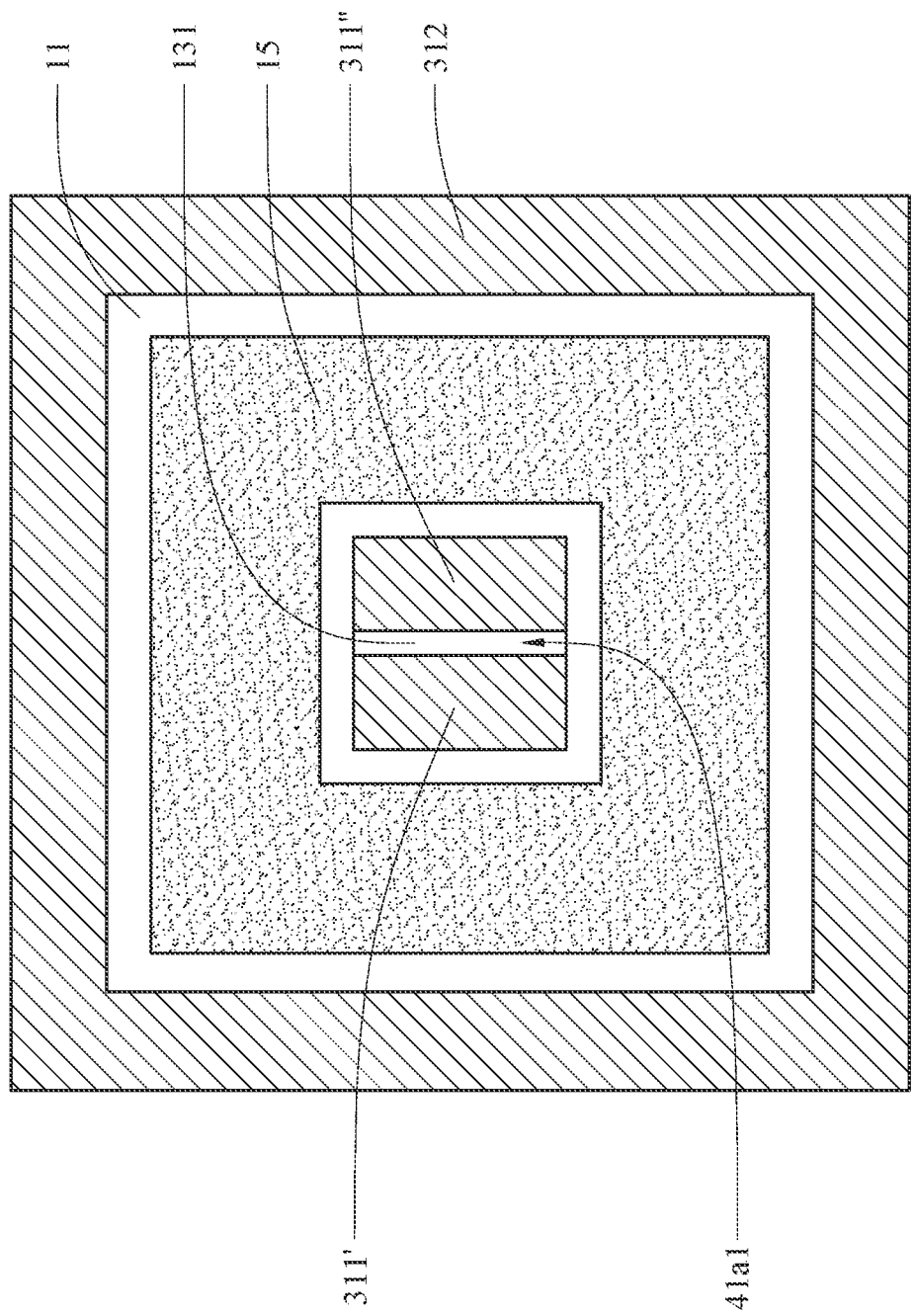
FIG. 8 is a schematic top view of FIG. 7.

Please refer to FIG. 3 to FIG. 17. FIG. 3, FIG. 5, FIG. 7, FIG. 9, FIG. 10, FIG. 12, and FIG. 14 to FIG. 17 are schematic side cross-sectional views illustrating a manufacturing method of the vertically integrated micro-bolometer 1 in FIG. 1A to FIG. 1D. FIG. 4 is a schematic top view of FIG. 3. FIG. 6 is a schematic top view of FIG. 5. FIG. 8 is a schematic top view of FIG. 7. FIG. 11 is a schematic top view of FIG. 10. FIG. 13 is a schematic top view of FIG. 12.

First, a step is performed to set a wavelength λ of an infrared ray to be measured. Then, a step is performed to provide an integrated circuit wafer (ASIC wafer) 10a having a plurality of chip areas. As shown in FIG. 3, a plurality of circuit elements (not shown), a silicon substrate 11, a plurality of electrically conductive traces 121, and a plurality of electrically conductive traces 122 are disposed at each of a plurality of chip areas. In the drawings of the disclosure, one of the integrated circuit chips 10 shown in FIG. 7 is illustrated as an example for manufacturing method of the vertically integrated micro-bolometer 1. Further, hereinafter, the following descriptions will mainly correspond to one of the integrated circuit chips 10 on integrated circuit wafer (ASIC wafer) 10a. A deposition manufacturing process is performed on the integrated circuit wafer 10a. In detail, a dielectric layer 13 and a metal reflective layer 15 are deposited on the silicon substrate 11 of the integrated circuit wafer 10a. The dielectric layer 13 includes a central dielectric layer 131 and a surrounding dielectric layer 132. The metal reflective layer 15 surrounds the central dielectric layer 131. The surrounding dielectric layer 132 surrounds the metal reflective layer 15. In this disclosure, a sequence for forming the dielectric layer 13 and the metal reflective layer 15 is not limited. The dielectric layer 13 may be formed before the metal reflective layer 15. Also, the metal reflective layer 15 may be formed before the dielectric layer 13. Further, the dielectric layer 13 and the metal reflective layer 15 may be formed simultaneously. In this embodiment, the dielectric layer 13 has a thickness T3, and the metal reflective layer 15 has a thickness T5. A material of the dielectric layer 13 may include silicon dioxide, and a material of the metal reflective layer 15 may include aluminum.

Figure 5:
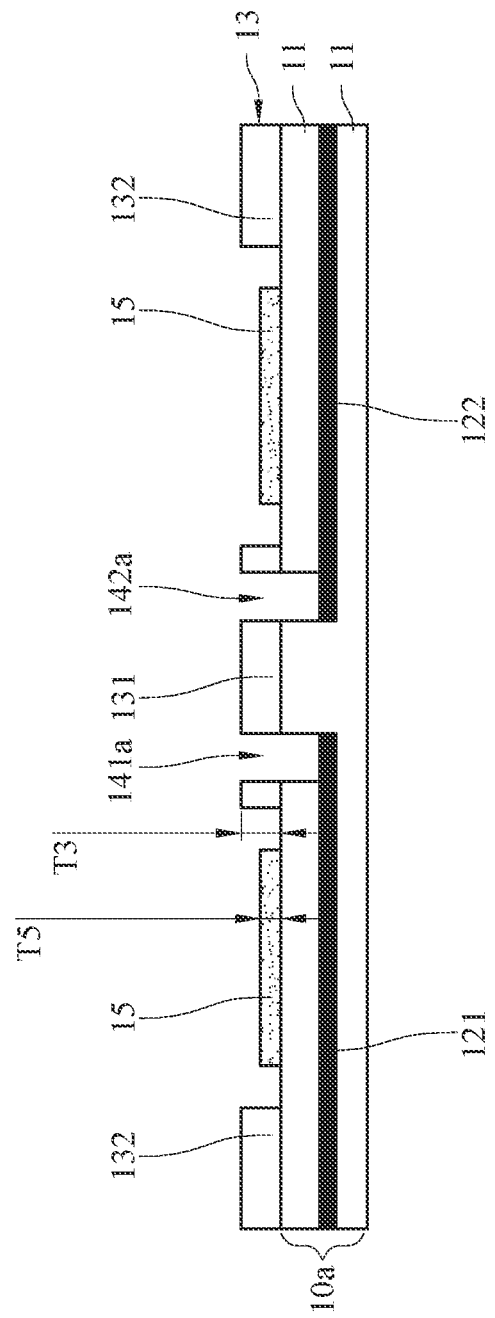
FIG. 5 is a schematic side cross-sectional view illustrating a manufacturing method of the vertically integrated micro-bolometer in FIG. 1A to FIG. 1D.
Figure 6:
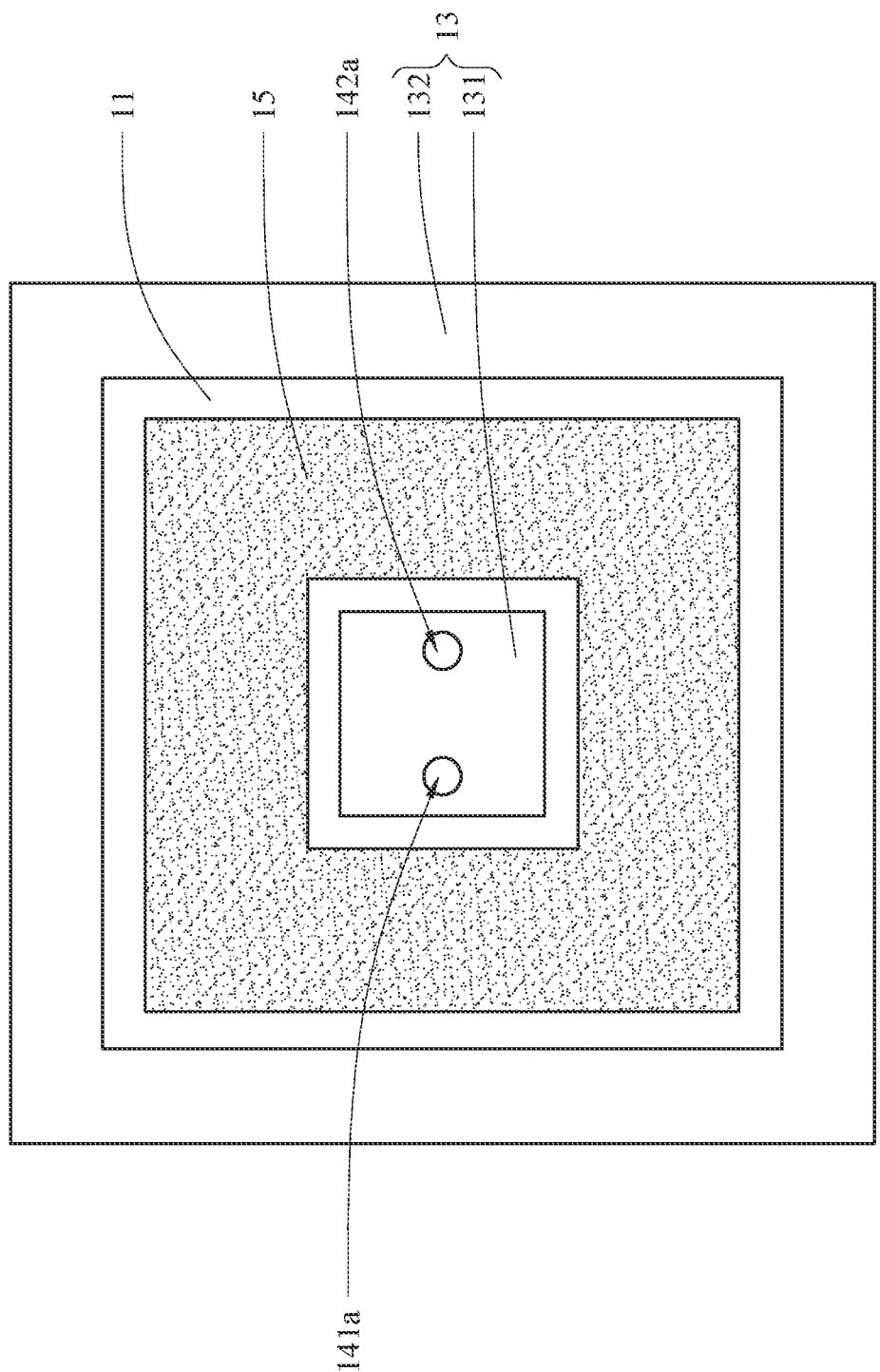
FIG. 6 is a schematic top view of FIG. 5.

As shown in FIG. 5 and FIG. 6, after the step of depositing the dielectric layer 13 on the silicon substrate 11, a first positive opening 141a and a first negative opening 142a are formed in the central dielectric layer 131. The first positive opening 141a is disposed through the central dielectric layer 131 and is disposed through a part of the silicon substrate 11 to reach the electrically conductive trace 121. The first negative opening 142a is disposed through the central dielectric layer 131 and is disposed through a part of the silicon substrate 11 to reach the electrically conductive trace 122.

As shown in FIG. 7 and FIG. 8, an electrically conductive material is disposed in the first positive opening 141a (FIG. 5 and FIG. 6) to form a first positive electrically conductive element 141 which is disposed through the central dielectric layer 131. An electrically conductive material is disposed in the first negative opening 142a (FIG. 5 and FIG. 6) to form a first negative electrically conductive element 142 which is disposed through the central dielectric layer 131. The first positive electrically conductive element 141 is electrically connected to the circuit element (not shown) through the electrically conductive trace 121. The first negative electrically conductive element 142 is electrically connected to the circuit element (not shown) through the electrically conductive trace 122. A material of the first positive electrically conductive element 141 and a material of the first negative electrically conductive element 142 may include copper.

Through the above processes, the integrated circuit chips 10, are formed on an integrated circuit wafer (ASIC wafer) 10a on which the integrated circuit chips 10 are connected to each other. The circuit elements, the silicon substrate 11, the electrically conductive traces 121, the electrically conductive traces 122, the dielectric layer 13, the first positive electrically conductive elements 141, the first negative electrically conductive elements 142, and the metal reflective layers 15 form the integrated circuit chips 10. The integrated circuit chips 10 respectively include the circuit elements, the electrically conductive traces 121, the electrically conductive traces 122, the first positive electrically conductive elements 141, the first negative electrically conductive elements 142, and the metal reflective layers 15. The silicon substrate 11 may be shared by the integrated circuit chips 10 which are connected to each other. The dielectric layer 13 may be shared by the integrated circuit chips 10 which are connected to each other.

Next, a first metal bonding layer 31 is deposited on the dielectric layer 13. The first metal bonding layer 31 includes a first central bonding layer 311 and a first surrounding bonding layer 312. The first central bonding layer 311 is connected to the central dielectric layer 131. The first surrounding bonding layer 312 is connected to the surrounding dielectric layer 132. After the step of depositing the first metal bonding layer 31 on the dielectric layer 13, a first bonding layer recess 41a1 is formed in the first central bonding layer 311. The first central bonding layer 311 includes two portions 311' and 311" which are separated and electrically insulated from each other by the first bonding layer recess 41a1. The first positive electrically conductive element 141 is electrically connected to the electrically conductive trace 121 and the portion 311' of the first central bonding layer 311. The first negative electrically conductive element 142 is electrically connected to the electrically conductive trace 122 and the portion 311" of the first central bonding layer 311. The first positive electrically conductive element 141 and the first negative electrically conductive element 142 are respectively located on two sides of the first bonding layer recess 41a1. A material of the first metal bonding layer 31 may include copper.

The manufacturing process in FIG. 3 to FIG. 8 described above is defined as a first process of a first wafer 100 which includes the integrated circuit chips 10 and the first metal bonding layer 31, wherein the integrated circuit chips 10 include the silicon substrate 11, the circuit elements, the electrically conductive traces 121, the electrically conductive traces 122, the dielectric layer 13, the first positive electrically conductive elements 141, the first negative electrically conductive elements 142, and the plurality of metal reflective layers 15.

Figure 9:
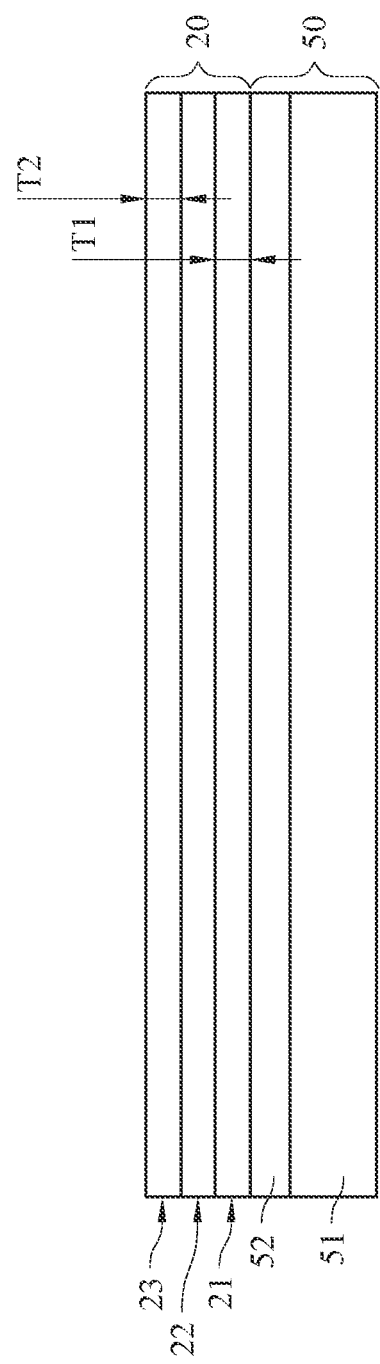
FIG. 9 is a schematic side cross-sectional view illustrating a manufacturing method of the vertically integrated micro-bolometer in FIG. 1A to FIG. 1D.

As shown in FIG. 9, a step is performed to provide a supporting wafer 50. An infrared sensing film manufacturing process is performed on the supporting wafer 50. A semiconductor manufacturing process is performed to deposit an infrared sensing film 20 on a supporting wafer 50. The supporting wafer 50 includes a silicon layer 51 and a dielectric layer 52. The infrared sensing film 20 includes a top absorbing layer 21, a sensing layer 22, and a bottom absorbing layer 23 which are deposited in sequence. That is, the top absorbing layer 21 is deposited on the dielectric layer 52 of the supporting wafer 50, the sensing layer 22 is deposited on the top absorbing layer 21, and the bottom absorbing layer 23 is deposited on the sensing layer 22. A thickness T1 of the top absorbing layer 21 is substantially equal to a thickness T2 of the bottom absorbing layer 23. Materials of the top absorbing layer 21 and the bottom absorbing layer 23 may include silicon nitride (SiN). A material of the sensing layer 22 may include silicon germanium alloy (SiGe) or silicon carbide (SiC).

Figure 10:
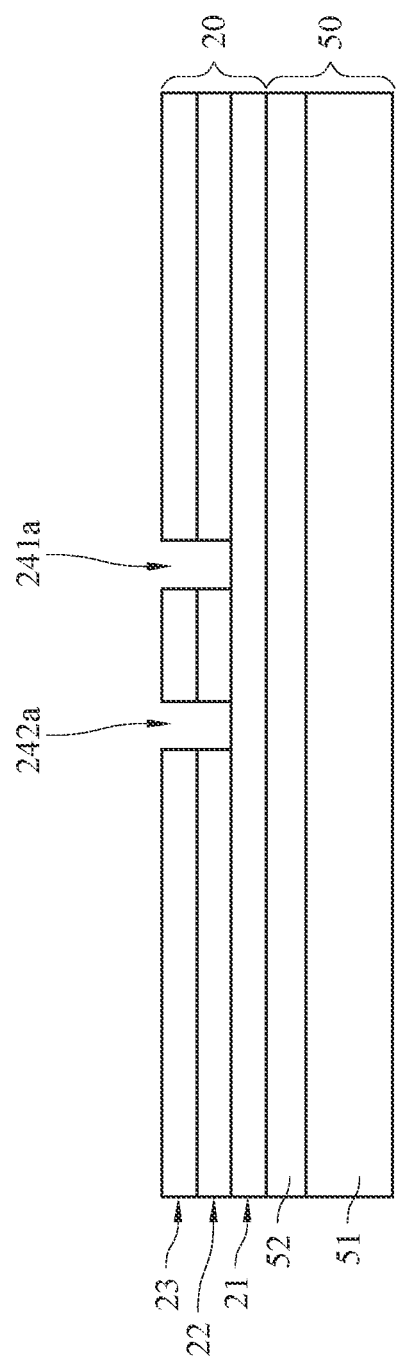
FIG. 10 is a schematic side cross-sectional view illustrating a manufacturing method of the vertically integrated micro-bolometer in FIG. 1A to FIG. 1D.
Figure 11:
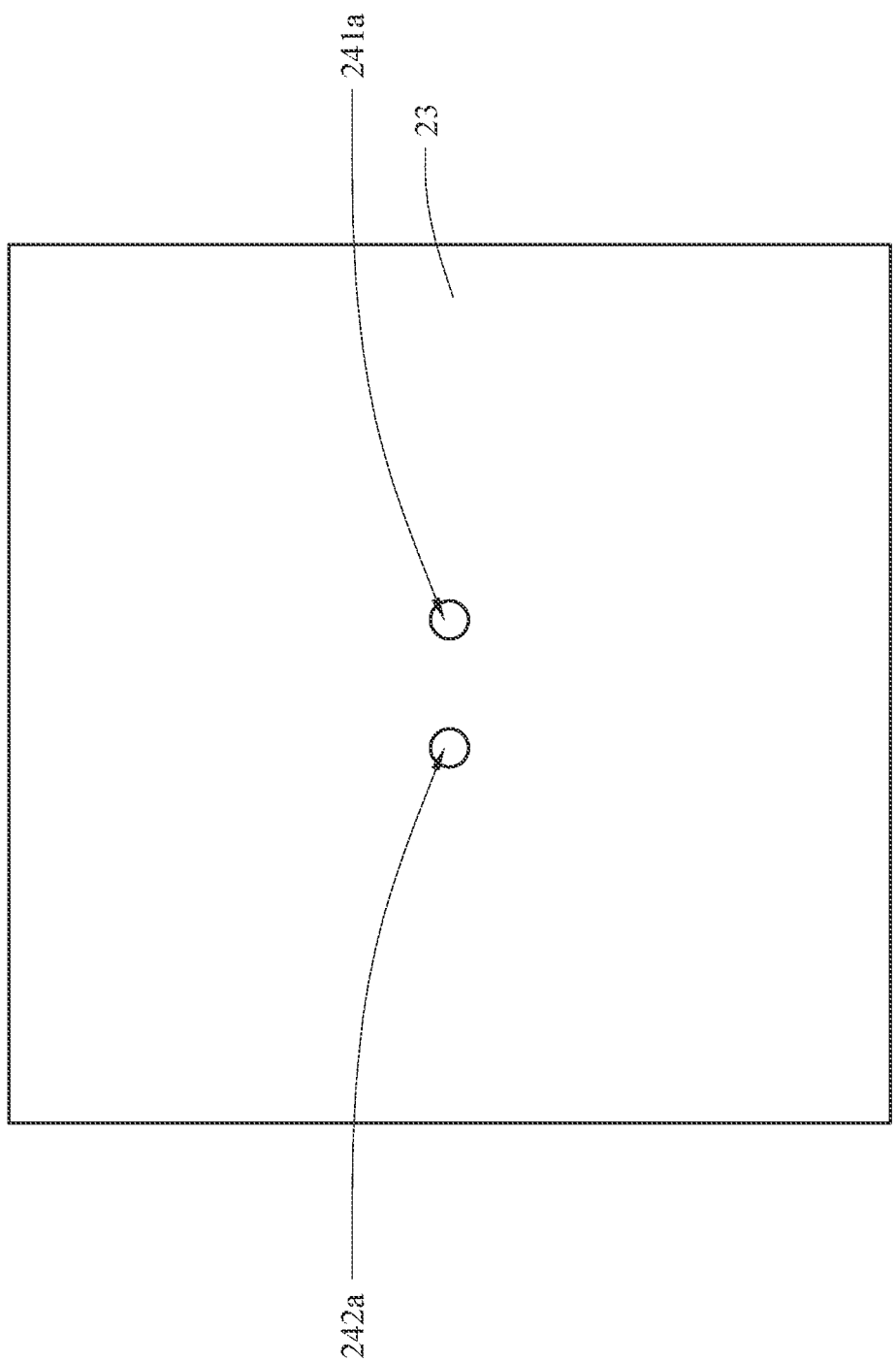
FIG. 11 is a schematic top view of FIG. 10.

As shown in FIG. 10 and FIG. 11, after the step of depositing the infrared sensing film 20 on a supporting wafer 50, a second positive opening 241a and a second negative opening 242a are formed and extended from the bottom absorbing layer 23. In this embodiment, each of the second positive opening 241a and the second negative opening 242a is disposed through the bottom absorbing layer 23 and the sensing layer 22 to reach the top absorbing layer 21. In another embodiment, each of the second positive opening and the second negative opening may be disposed through the bottom absorbing layer to reach the sensing layer. In other embodiments, each of the second positive opening and the second negative opening may be disposed through the bottom absorbing layer to reach an inside of the sensing layer. In other embodiments, each of the second positive opening and the second negative opening may be disposed through the bottom absorbing layer, the sensing layer, and the top absorbing layer to reach the dielectric layer of the supporting wafer.

Figure 12:
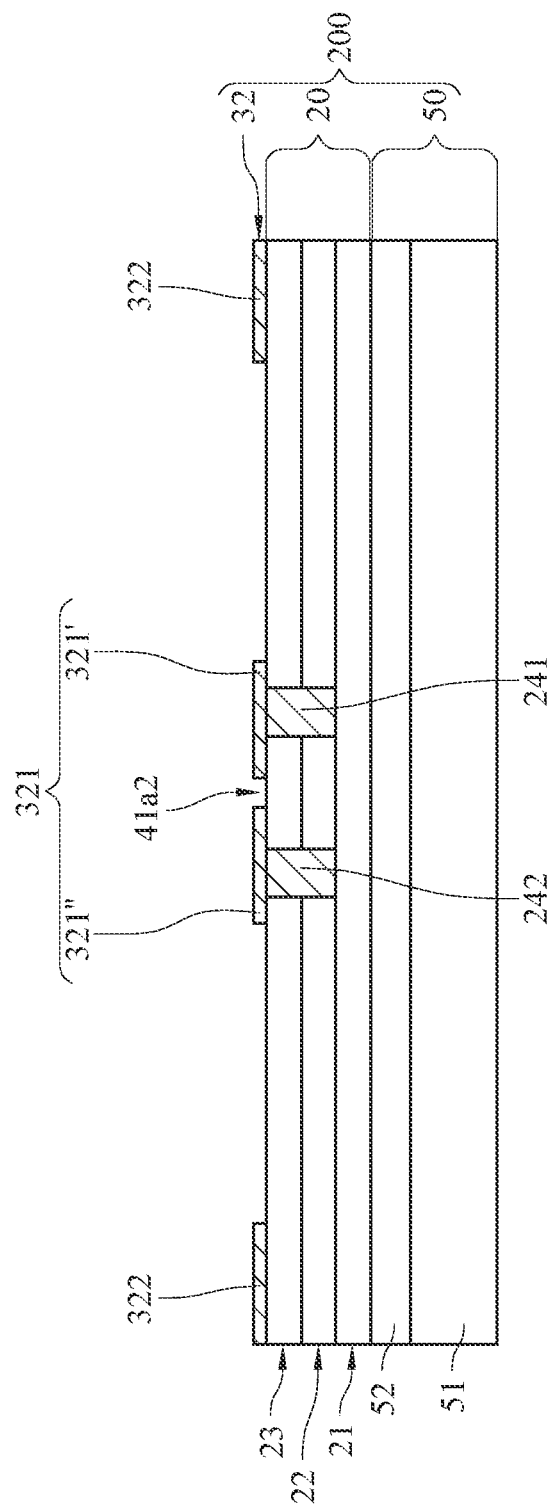
FIG. 12 is a schematic side cross-sectional view illustrating a manufacturing method of the vertically integrated micro-bolometer in FIG. 1A to FIG. 1D.
Figure 13:
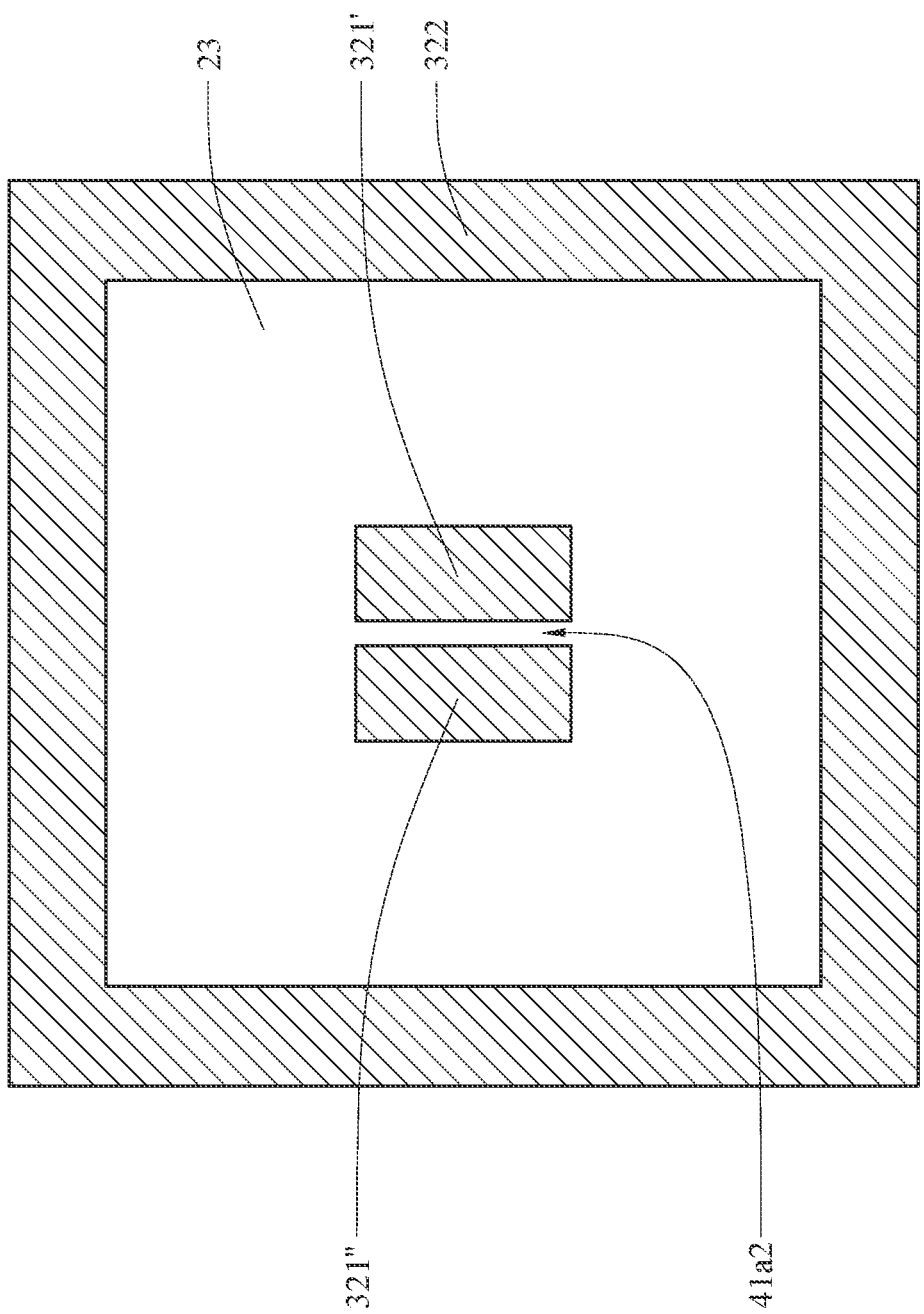
FIG. 13 is a schematic top view of FIG. 12.

As shown in FIG. 12 and FIG. 13, an electrically conductive material is disposed in the second positive opening 241a (FIG. 10 and FIG. 11) to form a second positive electrically conductive element 241 in the infrared sensing film 20. An electrically conductive material is disposed in the second negative opening 242a (FIG. 10 and FIG. 11) to form a second negative electrically conductive element 242 in the infrared sensing film 20. Each of the second positive electrically conductive element 241 and the second negative electrically conductive element 242 is electrically connected to the sensing layer 22. A material of the second positive electrically conductive element 241 and a material of the second negative electrically conductive element 242 may include cooper.

In addition, a second metal bonding layer 32 is deposited on the bottom absorbing layer 23. The second metal bonding layer 32 includes a second central bonding layer 321 and a second surrounding bonding layer 322. After the step of depositing the second metal bonding layer 32 on the bottom absorbing layer 23, a second bonding layer recess 41a2 is formed in the second central bonding layer 321. The second central bonding layer 321 includes two portions 321' and 321" which are separated and electrically insulated from each other by the second bonding layer recess 41a2. The second positive electrically conductive element 241 is electrically connected to the portion 321' of the second central bonding layer 321. The second negative electrically conductive element 242 is electrically connected to the portion 321" of the second central bonding layer 321. The second positive electrically conductive element 241 and the second negative electrically conductive element 242 are respectively located on two sides of the second bonding layer recess 41a2. A material of the second metal bonding layer 31 may include cooper.

The manufacturing process in FIG. 9 to FIG. 13 described above is defined as a second process of a second wafer 200 including the supporting wafer 50, the infrared sensing film 20, and the second metal bonding layer 32. The second wafer 200 including the plurality of second positive electrically conductive elements 241 and the plurality of second negative electrically conductive elements 242 may be formed by the second process. Locations of the second positive electrically conductive elements 241 may respectively correspond to the integrated circuit chips 10 in the first process. Locations of the second negative electrically conductive elements 242 may respectively correspond to the integrated circuit chips 10 in the first process. In this embodiment, the top absorbing layer 21, the sensing layer 22, and the bottom absorbing layer 23 may be directly deposited on the supporting wafer 50 at a high temperature through the semiconductor manufacturing process. Because the circuit elements of the integrated circuit chips 10 in the first process are not involved in the second process described above, the circuit elements of the integrated circuit chips 10 in the first process will not malfunction due to a manufacturing process with a high temperature of the second process of the second wafer 200.

The disclosure is not limited by the sequence of the first process and the second process described above. On the same manufacturing line, the first process may be performed before the second process, or the second process may be performed before the first process. The first process and the second process may be respectively performed on different manufacturing lines at the same time, or the first process and the second process may be respectively performed on different manufacturing lines at different time.

Figure 14:
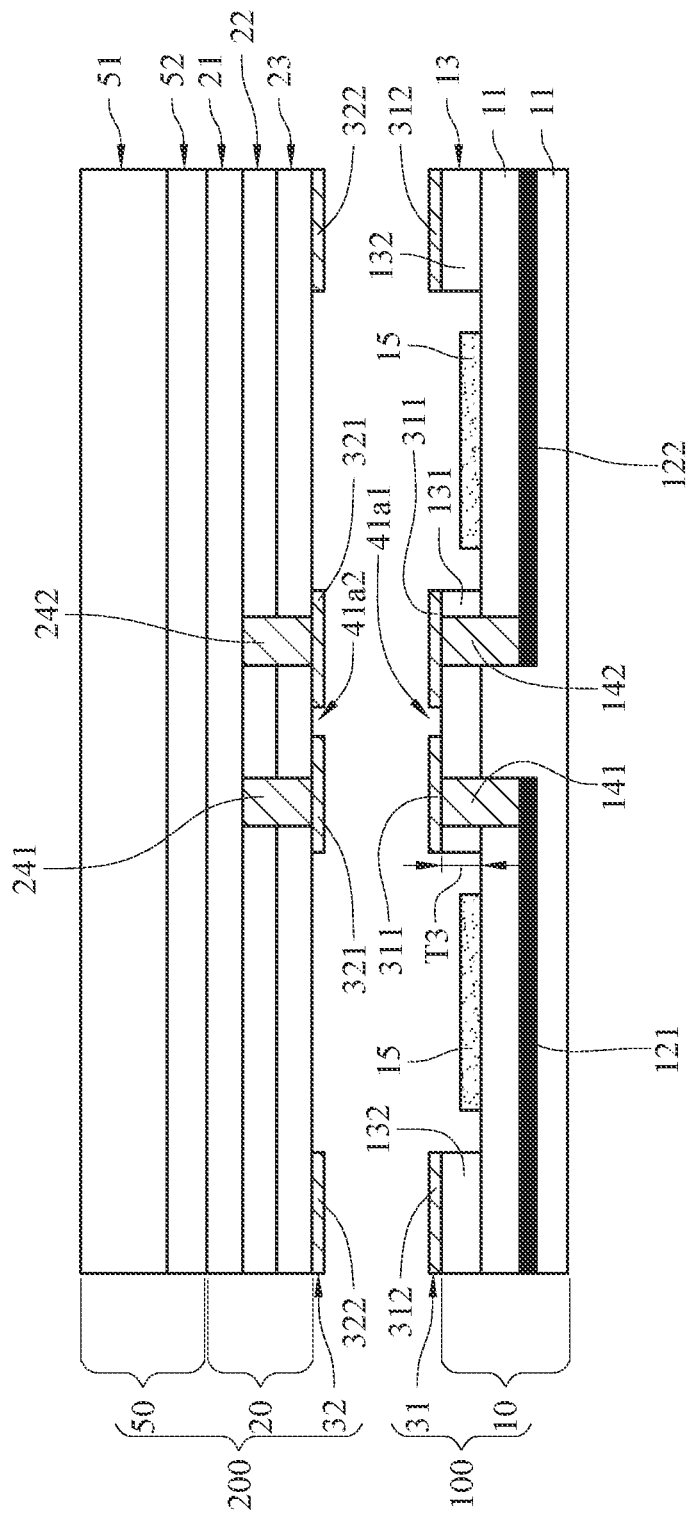
FIG. 14 is a schematic side cross-sectional view illustrating a manufacturing method of the vertically integrated micro-bolometer in FIG. 1A to FIG. 1D.

As shown in FIG. 14, the second wafer 200 is flipped, and the second wafer 200 is placed on the first wafer 100. When the manufacturing process is performed, the second central bonding layer 321 on the second wafer 200 will be aligned with and in contact with the first central bonding layer 311 on the first wafer 100, and the second surrounding bonding layer 322 on the second wafer 200 will be aligned with and in contact with the first surrounding bonding layer 312 on the first wafer 100.

Figure 15:
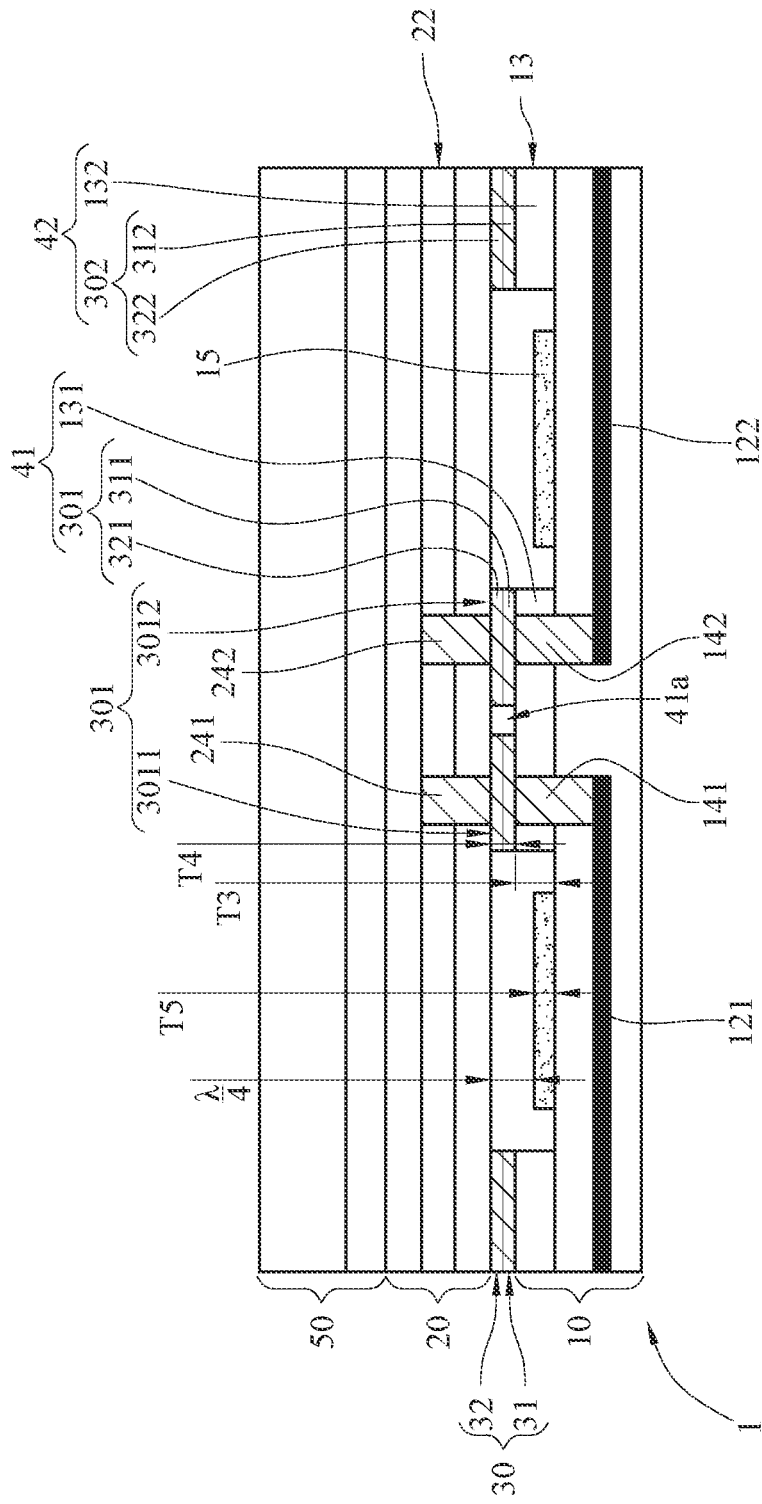
FIG. 15 is a schematic side cross-sectional view illustrating a manufacturing method of the vertically integrated micro-bolometer in FIG. 1A to FIG. 1D.

As shown in FIG. 14 and FIG. 15, a wafer metal bonding manufacturing process is performed to bond the infrared sensing film 20 of the second wafer 200 to the integrated circuit chip 10 of the first wafer 100. Thus, the integrated circuit chip 10 of the first wafer 100 and the infrared sensing film 20 of the second wafer 200 may be integrated into the vertically integrated micro-bolometer 1 through a metal bonding layer 30. The first metal bonding layer 31 is connected to the second metal bonding layer 32 to form the metal bonding layer 30. The first central bonding layer 311 is connected to the second central bonding layer 321 to form a central bonding layer 301. The first surrounding bonding layer 312 is connected to the second surrounding bonding layer 322 to form a surrounding bonding layer 302. Therefore, the lower surface of the central bonding layer 301 is connected to an upper surface of the central dielectric layer 131 to form a central anchor 41. The lower surface of the surrounding bonding layer 302 is connected to an upper surface of the surrounding dielectric layer 132 to form a surrounding wall 42 which surrounds the central anchor 41.

In the step of performing the wafer metal bonding manufacturing process to bond the infrared sensing film 20 to the integrated circuit chip 10, a sum of the thickness T3 of the dielectric layer 13 and a thickness T4 of the metal bonding layer 30 is substantially equal to a sum of a thickness T5 of the metal reflective layer 15 and a quarter of the wavelength (i.e. $\lambda/4$).

After the step of performing the wafer metal bonding manufacturing process to bond the infrared sensing film 20 to the integrated circuit chip 10, the first bonding layer recess 41a1 and the second bonding layer recess 41a2 are constructed into a bonding layer recess 41a. The central bonding layer 301 includes a positive bonding layer 3011 and a negative bonding layer 3012 which are separated and electrically insulated from each other by the bonding layer recess 41a. The first positive electrically conductive element 141 is electrically connected to the electrically conductive trace 121 and the positive bonding layer 3011. The first negative electrically conductive element 142 is electrically connected to the electrically conductive trace 122 and the negative bonding layer 3012. The second positive electrically conductive element 241 is electrically connected to the sensing layer 22 and the positive bonding layer 3011. The second negative electrically conductive element 242 is electrically connected to the sensing layer 22 and the negative bonding layer 3012.

The manufacturing process of performing the wafer metal bonding manufacturing process to bond the infrared sensing film 20 to the dielectric layer 13 of the integrated circuit chip 10 can be stable and can be compatible with the semiconductor manufacturing process, and thus a sharp variation of material properties of the infrared sensing film 20 is prevented. In addition, through the wafer metal bonding manufacturing process with a low temperature, not only the infrared sensing film 20 is vertically integrated on an/the integrated circuit chip 10, but also the circuit element in the integrated circuit chip 10 is avoided from malfunctioning due to the manufacturing process with a high temperature.

Figure 16:
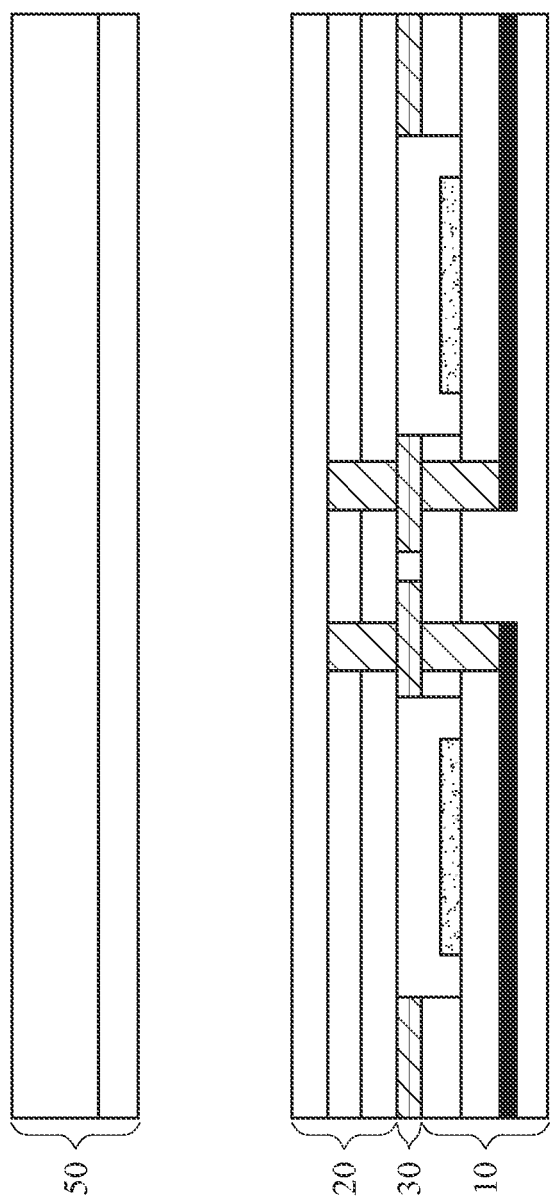
FIG. 16 is a schematic side cross-sectional view illustrating a manufacturing method of the vertically integrated micro-bolometer in FIG. 1A to FIG. 1D.

As shown in FIG. 16, a step is performed to remove the supporting wafer 50 so that the infrared sensing film 20 becomes a flat multilayer structure vertically integrated on the integrated circuit chip 10. The infrared sensing film 20 of this flat multilayer structure has a plurality of layers. Even though the infrared sensing film 20 is partially suspended or not supported, the infrared sensing film 20 still is maintained to be in a flat shape.

Figure 17:
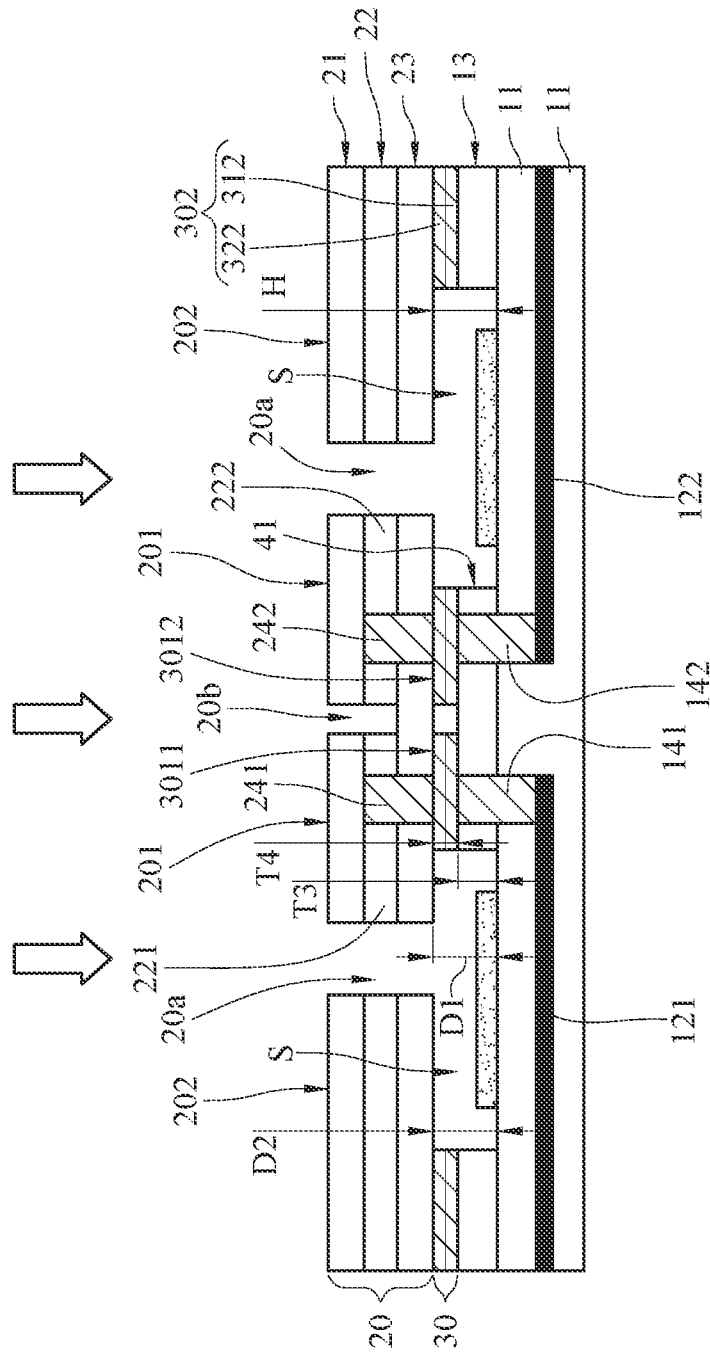
FIG. 17 is a schematic side cross-sectional view illustrating a manufacturing method of the vertically integrated micro-bolometer in FIG. 1A to FIG. 1D.

As shown in FIG. 17 and FIG. 2, a step is performed to etch the infrared sensing film 20 and such step includes forming a plurality of slots 20a and forming a sensing layer recess 20b (shown by the white arrow in FIG. 17). The slots 20a are disposed through the infrared sensing film 20. The infrared sensing film 20 is divided into a central sensing film 201, a surrounding sensing film 202, and a plurality of connecting portions 203 by the slots 20a. The surrounding sensing film 202 surrounds the central sensing film 201. Each of the connecting portions 203 connects the surrounding sensing film 202 and the central sensing film 201. A central distance D1 from a lower surface of the bottom absorbing layer 23 of the central sensing film 201 to an upper surface of the silicon substrate 11 is substantially equal to a surrounding distance D2 from a lower surface of the bottom absorbing layer 23 of the surrounding sensing film 202 to the upper surface of the silicon substrate 11. Both of the central distance D1 and the surrounding distance D2 are substantially equal to the sum of the thickness T3 of the dielectric layer 13 and the thickness T4 of the metal bonding layer 30.

After the step of connecting the first surrounding bonding layer 312 to the second surrounding bonding layer 322 to form the surrounding bonding layer 302, the surrounding bonding layer 302 is connected to the bottom absorbing layer 23 of the surrounding sensing film 202 to form a thermally insulating cavity S surrounding the central anchor 41. A height H of the thermally insulating cavity S is substantially equal to the sum of the thickness T3 of the dielectric layer 13 and the thickness T4 of the metal bonding layer 30.

The sensing layer recess 20b is formed from the top absorbing layer 21 of the central sensing film 201 toward the bottom absorbing layer 23. In this embodiment, the sensing layer recess 20b is disposed through the top absorbing layer 21 of the central sensing film 201 and the sensing layer 22 of the central sensing film 201. The sensing layer 22 of the central sensing film 201 includes a positive sensing layer 221 and a negative sensing layer 222 which are separated and electrically insulated from each other by the sensing layer recess 20b. The positive sensing layer 221 and the negative sensing layer 222 are respectively located on two sides of the sensing layer recess 20b. The second positive electrically conductive element 241 and the second negative electrically conductive element 242 are respectively electrically connected to the positive sensing layer 221 and the negative sensing layer 222.

The positive bonding layer 3011 connects the first positive electrically conductive element 141 and the second positive electrically conductive element 241 to form a positive electrical channel by which the electrically conductive trace 121 can electrically connect to the positive sensing layer 221. The negative bonding layer 3012 connects the first negative electrically conductive element 142 and the second negative electrically conductive element 242 to form a negative electrical channel by which the electrically conductive trace 122 can electrically connect to the negative sensing layer 222. Through the above processes, the vertically integrated micro-bolometers 1, which are connected to each other, may be formed. Next, a die-dicing manufacturing process may be performed to separate the vertically integrated micro-bolometers 1 which are connected to each other. Thus, through the processes above, the mass production of the vertically integrated micro-bolometers 1 of this disclosure is enabled, thereby greatly reducing a production cost.

As discussed above, in the vertically integrated micro-bolometer and the manufacturing method thereof in one embodiment of the disclosure, a material, such as silicon germanium alloy (SiGe) or silicon carbide (SiC) that has a low resistivity and is compatible with a semiconductor manufacturing process is used for the sensing layer. Furthermore, the vertically integrated micro-bolometer can be manufactured completely by the semiconductor manufacturing process technology. Thus, not only the measurement sensitivity of the vertically integrated micro-bolometer is improved, but also a production cost of the vertically integrated micro-bolometer is reduced. In addition, in the embodiments of the disclosure, the manufacturing method where the infrared sensing film is vertically bonded to the integrated circuit chip by the wafer metal bonding manufacturing process with a low temperature is used to avoid the circuit element in the integrated circuit chip from malfunctioning due to a high temperature of the infrared sensing film depositing process. On the other hand, in this disclosure, after the infrared sensing film formed by silicon germanium alloy (SiGe) or silicon carbide (SiC) is successfully vertically integrated with the integrated circuit chip, the footprint area of the vertically integrated micro-bolometer of the disclosure may be effectively reduced. Thus, a unit manufacturing cost of the vertically integrated micro-bolometer of the disclosure is significantly reduced, thereby allowing the vertically integrated micro-bolometer of the disclosure to be applied to a mobile product such as a smart phone or a smart watch.

Although the disclosure is disclosed in the foregoing embodiments, it is not intended to limit the disclosure. All variations and modifications made without departing from the spirit and scope of the disclosure fall within the scope of the disclosure. For the scope defined by the disclosure, please refer to the attached claims.

What is claimed is:

1. A vertically integrated micro-bolometer, for sensing an infrared ray with a wavelength, comprising:
   an integrated circuit chip comprising:
      a silicon substrate;
      a circuit element; and
      a dielectric layer disposed on the silicon substrate and exposing a part of the silicon substrate;
   an infrared sensing film being a flat multilayer structure, comprising:
      a top absorbing layer;
      a bottom absorbing layer, wherein materials of the top absorbing layer and the bottom absorbing layer are materials compatible with a semiconductor manufacturing process; and
      a sensing layer disposed between the top absorbing layer and the bottom absorbing layer, wherein a material of the sensing layer is silicon germanium alloy (SiGe) or silicon carbide (SiC) which are materials compatible with a semiconductor manufacturing process; and
   a metal bonding layer connecting the dielectric layer and the bottom absorbing layer so that the infrared sensing film is vertically integrated on the integrated circuit chip and the sensing layer is electrically connected to the circuit element.

2. The vertically integrated micro-bolometer according to claim 1, wherein the infrared sensing film is divided into a central sensing film, a surrounding sensing film, and a plurality of connecting portions by a plurality of slots, the surrounding sensing film surrounds the central sensing film, each of the plurality of connecting portions connects the surrounding sensing film and the central sensing film, and a central distance from the bottom absorbing layer of the central sensing film to the silicon substrate is substantially equal to a surrounding distance from the bottom absorbing layer of the surrounding sensing film to the silicon substrate.

3. The vertically integrated micro-bolometer according to claim 2, wherein a thickness of the top absorbing layer is substantially equal to a thickness of the bottom absorbing layer.

4. The vertically integrated micro-bolometer according to claim 2, wherein the central distance is substantially equal to a sum of a thickness of the dielectric layer and a thickness of the metal bonding layer, and the surrounding distance is substantially equal to the sum of the thickness of the dielectric layer and the thickness of the metal bonding layer.

5. The vertically integrated micro-bolometer according to claim 4, wherein the integrated circuit chip further comprises a metal reflective layer disposed on a part of the silicon substrate exposed by the dielectric layer, and the sum of the thickness of the dielectric layer and the thickness of the metal bonding layer is substantially equal to a sum of a thickness of the metal reflective layer and a quarter of the wavelength.

6. The vertically integrated micro-bolometer according to claim 4, wherein the dielectric layer comprises a central dielectric layer and a surrounding dielectric layer surrounding the central dielectric layer, and the metal bonding layer comprises a central bonding layer and a surrounding bonding layer surrounding the central bonding layer.

7. The vertically integrated micro-bolometer according to claim 6, wherein a lower surface of the central bonding layer is connected to an upper surface of the central dielectric layer to form a central anchor.

8. The vertically integrated micro-bolometer according to claim 7, wherein an upper surface of the central bonding layer is connected to the bottom absorbing layer of the central sensing film to support the central sensing film.

9. The vertically integrated micro-bolometer according to claim 7, wherein a lower surface of the surrounding bonding layer is connected to an upper surface of the surrounding dielectric layer to form a surrounding wall.

10. The vertically integrated micro-bolometer according to claim 9, wherein an upper surface of the surrounding bonding layer is connected to the bottom absorbing layer of the surrounding sensing film to form a thermally insulating cavity surrounding the central anchor.

11. The vertically integrated micro-bolometer according to claim 10, wherein a height of the thermally insulating cavity is substantially equal to the sum of the thickness of the dielectric layer and the thickness of the metal bonding layer.

12. The vertically integrated micro-bolometer according to claim 7, wherein the central anchor has a bonding layer recess, and the central bonding layer comprises a positive bonding layer and a negative bonding layer which are separated and electrically insulated from each other by the bonding layer recess.

13. The vertically integrated micro-bolometer according to claim 12, wherein the central sensing film has a sensing layer recess, and the sensing layer of the central sensing film comprises a positive sensing layer and a negative sensing layer which are separated and electrically insulated from each other by the sensing layer recess.

14. The vertically integrated micro-bolometer according to claim 13, wherein the integrated circuit chip further comprises a first positive electrically conductive element, the first positive electrically conductive element is disposed through the central dielectric layer and electrically connected to the circuit element, the infrared sensing film further comprises a second positive electrically conductive element, the second positive electrically conductive element is disposed through the bottom absorbing layer of the central sensing film and electrically connected to the positive sensing layer, the positive bonding layer connects the first positive electrically conductive element and the second positive electrically conductive element to form an positive electrical channel, and the positive electrical channel is electrically connected to the circuit element and the positive sensing layer.

15. The vertically integrated micro-bolometer according to claim 13, wherein the integrated circuit chip further comprises a first negative electrically conductive element, the first negative electrically conductive element is disposed through the central dielectric layer and electrically connected to the circuit element, the infrared sensing film further comprises a second negative electrically conductive element, the second negative electrically conductive element is disposed through the bottom absorbing layer of the central sensing film and electrically connected to the negative sensing layer, the negative bonding layer connects the first negative electrically conductive element and the second negative electrically conductive element to form a negative electrical channel, and the negative electrical channel is electrically connected to the circuit element and the negative sensing layer.

16. A manufacturing method of a vertically integrated micro-bolometer, comprising:
    setting a wavelength of an infrared ray to be measured;
    providing an integrated circuit wafer comprising a plurality of circuit elements and a silicon substrate;
    performing a deposition manufacturing process on the integrated circuit wafer to form a first wafer, wherein the deposition manufacturing process comprises:
        depositing a dielectric layer on the silicon substrate;
        depositing a plurality of metal reflective layers on the silicon substrate; and
        depositing a first metal bonding layer on the dielectric layer;
        wherein the plurality of circuit elements, the silicon substrate, the dielectric layer, and the plurality of metal reflective layers form a plurality of integrated circuit chips which are connected to each other;
    providing a supporting wafer;
    performing an infrared sensing film manufacturing process on the supporting wafer to form a second wafer, wherein the infrared sensing film manufacturing process comprises:
        performing a semiconductor manufacturing process to deposit an infrared sensing film on the supporting wafer, wherein the infrared sensing film comprises a top absorbing layer, a sensing layer, and a bottom absorbing layer, the top absorbing layer is deposited on the supporting wafer, the sensing layer is deposited on the top absorbing layer, the bottom absorbing layer is deposited on the sensing layer, and a material of the sensing layer is silicon germanium alloy (SiGe) or silicon carbide (SiC) which are materials compatible with a semiconductor manufacturing process; and
        depositing a second metal bonding layer on the bottom absorbing layer;
    performing a wafer metal bonding manufacturing process to bond the second wafer to the first wafer so that the first metal bonding layer of the first wafer is connected to the second metal bonding layer of the second wafer to form a metal bonding layer;
    removing the supporting wafer of the second wafer so that the infrared sensing film forms a flat multilayer structure;

etching the infrared sensing film so that the infrared sensing film has a plurality of slots to form a plurality of vertically integrated micro-bolometers which are connected to each other; and performing a die-dicing manufacturing process to separate the plurality of vertically integrated micro-bolometers which are connected to each other.

17. The manufacturing method according to claim 16, wherein a sum of a thickness of the dielectric layer and a thickness of the metal bonding layer is substantially equal to a sum of a thickness of each of the plurality of metal reflective layers and a quarter of the wavelength.

18. The manufacturing method according to claim 17, wherein the dielectric layer includes a plurality of central dielectric layers and a surrounding dielectric layer, each of the plurality of metal reflective layers surrounds each of the plurality of central dielectric layers, the surrounding dielectric layer surrounds each of the plurality of metal reflective layers, the first metal bonding layer includes a plurality of first central bonding layers and a first surrounding bonding layer, each of the plurality of first central bonding layers is connected to each of the plurality of central dielectric layers, the first surrounding bonding layer is connected to the surrounding dielectric layer, the second metal bonding layer includes a plurality of second central bonding layers and a second surrounding bonding layer, each of the plurality of first central bonding layers is connected to each of the plurality of second central bonding layers to form a central bonding layer, the first surrounding bonding layer is connected to the second surrounding bonding layer to form a surrounding bonding layer, each of the plurality of central bonding layers is connected to each of the plurality of central dielectric layers to form a central anchor, the surrounding bonding layer is connected to the surrounding dielectric layer to form a surrounding wall, the surrounding wall surrounds each of the plurality of central anchors, the plurality of slots are disposed through the infrared sensing film, the infrared sensing film is divided into a plurality of central sensing films, a surrounding sensing film and a plurality of connecting portions by the plurality of slots, the surrounding sensing film surrounds each of the plurality of central sensing films, the plurality of connecting portions connect the surrounding sensing film and each of the plurality of central sensing films, and a central distance from the bottom absorbing layer of each of the plurality of central sensing films to the silicon substrate is substantially equal to a surrounding distance from the bottom absorbing layer of the surrounding sensing film to the silicon substrate.

19. The manufacturing method according to claim 18, wherein in the step of performing the wafer metal bonding manufacturing process to bond the second wafer to the first wafer, the central distance from the bottom absorbing layer of each of the plurality of central sensing films to the silicon substrate and the surrounding distance from the bottom absorbing layer of the surrounding sensing film to the silicon substrate are both substantially equal to the sum of the thickness of the dielectric layer and the thickness of the metal bonding layer.

20. The manufacturing method according to claim 18, wherein after the step that the first surrounding bonding layer is connected to the second surrounding bonding layer to form the surrounding bonding layer, the surrounding bonding layer is connected to the bottom absorbing layer of the surrounding sensing film to form a thermally insulating cavity surrounding each of the plurality of central anchors, and a height of the thermally insulating cavity is substantially equal to the sum of the thickness of the dielectric layer and the thickness of the metal bonding layer.

21. The manufacturing method according to claim 18, wherein after the step of depositing the first metal bonding layer on the dielectric layer, forming a first bonding layer recess in each of the plurality of first central bonding layers, after the step of depositing the second metal bonding layer on the bottom absorbing layer, forming a second bonding layer recess in each of the plurality of second central bonding layers, after the step of performing the wafer metal bonding manufacturing process to bond the second wafer to the first wafer, each of the plurality of first bonding layer recesses and each of the plurality of second bonding layer recesses are constructed into a bonding layer recess, each of the plurality of central bonding layers comprises a positive bonding layer and a negative bonding layer which are separated and electrically insulated from each other by each of the plurality of bonding layer recesses.

22. The manufacturing method according to claim 21, wherein after the step of depositing the dielectric layer on the silicon substrate, in each of the plurality of central dielectric layers, forming a first positive electrically conductive element and a first negative electrically conductive element which are respectively disposed through each of the plurality of central dielectric layers, each of the plurality of first positive electrically conductive elements is electrically connected to each of the plurality of circuit elements and each of the plurality of positive bonding layers, and each of the plurality of first negative electrically conductive elements is electrically connected to each of the plurality of circuit elements and each of the plurality of negative bonding layers.

23. The manufacturing method according to claim 18, wherein the step of etching the infrared sensing film further comprises forming a plurality of sensing layer recesses, and the sensing layer of each of the plurality of central sensing films comprises a positive sensing layer and a negative sensing layer which are separated and electrically insulated from each other by each of the plurality of sensing layer recesses.

24. The manufacturing method according to claim 23, wherein after the step of depositing the infrared sensing film on the supporting wafer, in each of the plurality of central sensing films, forming a second positive electrically conductive element and a second negative electrically conductive element which are respectively disposed through the bottom absorbing layer of each of the plurality of central sensing films, and each of the plurality of second positive electrically conductive elements and each of the plurality of second negative electrically conductive elements are respectively electrically connected to each of the plurality of positive sensing layers and each of the plurality of negative sensing layers.

* * * * *